United States Patent
Seo et al.

(10) Patent No.: US 12,421,394 B2
(45) Date of Patent: *Sep. 23, 2025

(54) CORE-SHELL DYE, PHOTO-SENSITIVE RESIN COMPOSITION COMPRISING SAME, AND COLOR FILTER

(71) Applicant: SAMSUNG SDI CO., LTD., Yongin-si (KR)

(72) Inventors: Hyewon Seo, Suwon-si (KR);
Chaewon Pak, Suwon-si (KR);
Myoungyoup Shin, Suwon-si (KR);
Sunwoong Shin, Suwon-si (KR);
Euisoo Jeong, Suwon-si (KR);
Kyubuem Choi, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 595 days.

This patent is subject to a terminal disclaimer.

(21) Appl. No.: 17/391,348

(22) Filed: Aug. 2, 2021

(65) Prior Publication Data
US 2021/0355327 A1     Nov. 18, 2021

Related U.S. Application Data

(63) Continuation of application No. 16/090,670, filed as application No. PCT/KR2017/001027 on Jan. 31, 2017, now Pat. No. 11,091,645.

(30) Foreign Application Priority Data

Aug. 17, 2016   (KR) .................. 10-2016-0104345

(51) Int. Cl.
*C09B 53/00*   (2006.01)
*C09B 57/00*   (2006.01)
(Continued)

(52) U.S. Cl.
CPC ............ *C09B 53/00* (2013.01); *C09B 57/007* (2013.01); *G02B 5/20* (2013.01); *G03F 7/028* (2013.01); *G03F 7/032* (2013.01); *G03F 7/105* (2013.01)

(58) Field of Classification Search
CPC ....... C09B 53/00; C09B 53/02; C09B 57/007; G02B 5/20; G02B 5/223; C07C 233/64; G03F 7/0007; C08G 83/007
See application file for complete search history.

(56) References Cited

U.S. PATENT DOCUMENTS 8,273,875 B2 *   9/2012   Smith .................. C07D 471/22
                                                 540/461
8,642,014 B2 *   2/2014   Terpetschnig .......... A61P 43/00
                                                 435/40.5
(Continued)

FOREIGN PATENT DOCUMENTS

EP     2129788 B1    9/2014
JP     06-041458 A   2/1994
(Continued)

OTHER PUBLICATIONS

English translation of JP2016117858. (Year: 2016).*
(Continued)

*Primary Examiner* — Mark F. Huff
*Assistant Examiner* — Anna Malloy
(74) *Attorney, Agent, or Firm* — Lee IP Law, P.C.

(57) ABSTRACT

A core-shell dye including a core having a compound represented by Chemical Formula 1 and a shell surrounding the core and represented by Chemical Formula 2 or Chemical Formula 3, a photosensitive resin composition including the same, and a color filter manufactured using the photosensitive resin composition.

(Continued)

[Chemical Formula 1]

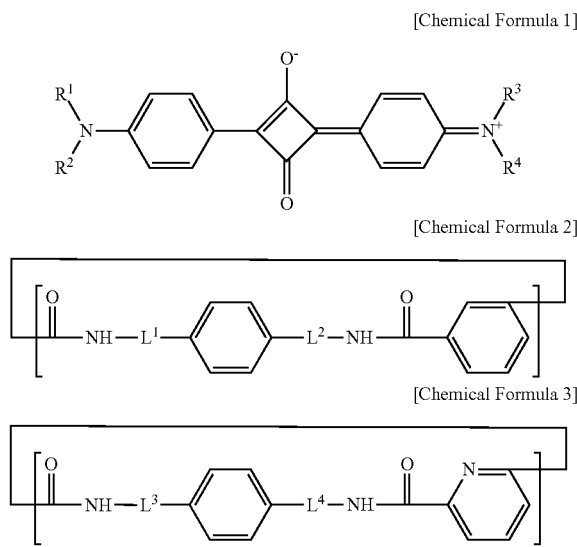

[Chemical Formula 2]

[Chemical Formula 3]

(In Chemical Formulae 1 to 3, each substituent is the same as defined in the specification.)

12 Claims, 1 Drawing Sheet

(51) Int. Cl.
　　*G02B 5/20* (2006.01)
　　*G03F 7/028* (2006.01)
　　*G03F 7/032* (2006.01)
　　*G03F 7/105* (2006.01)

(56) References Cited

U.S. PATENT DOCUMENTS

| | | | | |
|---|---|---|---|---|
| 11,041,073 | B2* | 6/2021 | Jeong | G03F 7/0007 |
| 11,091,645 | B2* | 8/2021 | Seo | C09B 67/0097 |
| 11,427,529 | B2* | 8/2022 | Jeong | G02B 5/223 |

FOREIGN PATENT DOCUMENTS

| | | | |
|---|---|---|---|
| JP | 07-140654 | A | 6/1995 |
| JP | 10-254133 | A | 9/1998 |
| JP | 2015-086378 | A | 5/2015 |
| JP | 2015-098589 | A | 5/2015 |
| JP | 2016117858 | A * | 6/2016 |
| KR | 10-1999-0007097 | A | 1/1999 |
| KR | 10-2002-0015650 | A | 2/2002 |
| KR | 10-2005-0020653 | A | 3/2005 |
| KR | 10-2009-0106226 | A | 10/2009 |
| KR | 10-2010-0078845 | A | 7/2010 |
| KR | 10-2010-0080142 | A | 7/2010 |
| KR | 10-2014-0072682 | A | 6/2014 |
| KR | 10-1413072 | B1 | 6/2014 |
| KR | 10-2015-0034626 | | 4/2015 |
| KR | 10-1531616 | B1 | 6/2015 |
| KR | 10-2015-0098587 | A | 8/2015 |
| TW | 201543148 | A | 11/2015 |
| WO | WO 2008-094637 | A2 | 8/2008 |
| WO | WO 2011-059457 | A1 | 5/2011 |

OTHER PUBLICATIONS

Arunkumar et al., "Squaraine-Derived Rotaxanes: Highly Stable, Fluorescent Near-IR Dyes", 2006, Chem. Eur. J., 12, 4684-4690. (Year: 2006).*

Easwaran Arunkumar, et al., "Squaraine-Derived Rotaxanes: Highly Stable, Fluorescent Near-IR Dyes", Chem. Eur. J. 2006, 12, 4684-4690.

James R. Johnson, et al., "Squaraine Rotaxanes : Superior Substitutes for Cy-5 in Molecular Probes for Near-Infrared Fluorescence Cell Imaging", Angew. Chem. Int. Ed. 2007, 46, 5528-5531.

Rekha R. Avirah, "Squaraine dyes in PDT: from basic design to in vivo demonstration", Org. Biomol. Chem., 2012, 10, 911-920.

Shuzhen Liao, et al., "Modulated Dye Retention for the Signal-On Fluorometric Determination of Acetylcholinesterase Inhibitor", Anal. Chem. 2013, vol. 85, pp. 4968-4973.

Lei Hu, et al., "Advances in synthesis and application of near-infrared absorbing squaraine dyes", RSC Adv., 2013, vol. 3, pp. 7667-7676.

* cited by examiner

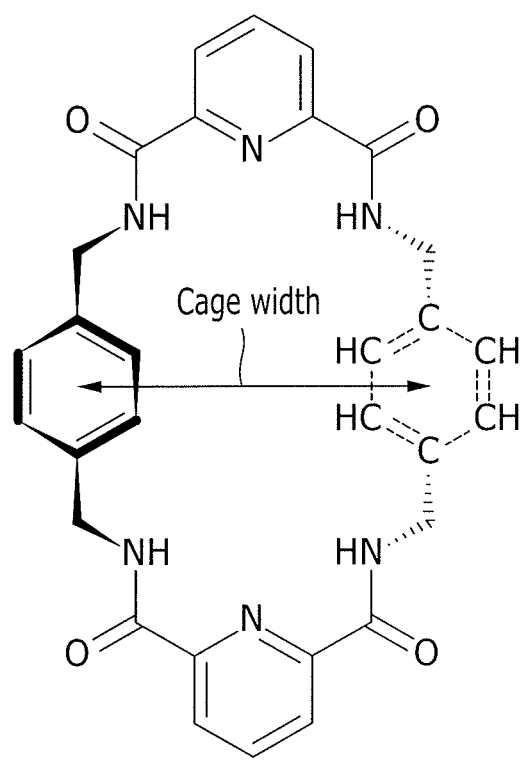

CORE-SHELL DYE, PHOTO-SENSITIVE RESIN COMPOSITION COMPRISING SAME, AND COLOR FILTER

CROSS REFERENCE TO RELATED APPLICATIONS

This is a continuation application based on pending application Ser. No. 16/090,670, filed on Oct. 2, 2018. The parent application Ser. No. 16/090,670 is the U.S. national phase application based on PCT Application No. PCT/KR2017/001027, filed on Jan. 31, 2017, which is based on Korean Patent Application No. 10-2016-0104345, filed on Aug. 17, 2016, the entire contents of all of which are hereby incorporated by reference.

BACKGROUND OF THE INVENTION

(a) Field of the Invention

This disclosure relates to a core-shell dye, a photosensitive resin composition including the same, and a color filter manufactured using the same.

(b) Description of the Related Art

A liquid crystal display device among many kinds of displays has an advantage of lightness, thinness, low cost, low power consumption for operation, and improved adherence to an integrated circuit and has been more widely used for a laptop computer, a monitor, and a TV screen. The liquid crystal display device includes a lower substrate on which a black matrix, a color filter, and an ITO pixel electrode are formed, and an upper substrate on which an active circuit portion including a liquid crystal layer, a thin film transistor, and a capacitor layer and an ITO pixel electrode are formed. Color filters are formed in a pixel region by sequentially stacking a plurality of color filters (in general, formed of three primary colors such as red (R), green (G), and blue (B) in a predetermined order to form each pixel, and a black matrix layer is disposed in a predetermined pattern on a transparent substrate to form a boundary between the pixels. The pigment dispersion method that is one of methods of forming a color filter provides a colored thin film by repeating a series of processes such as coating a photopolymerizable composition including a colorant on a transparent substrate including a black matrix, exposing a formed pattern to light, removing a non-exposed part with a solvent, and thermally curing the same. A coloring photosensitive resin composition used for manufacturing a color filter according to the pigment dispersion method generally includes an alkali soluble resin, a photopolymerizable monomer, a photopolymerization initiator, an epoxy resin, a solvent, other additives, and the like. The pigment dispersion method is actively applied to manufacture an LCD such as a mobile phone, a laptop, a monitor, and TV. However, a photosensitive resin composition for a color filter for the pigment dispersion method has recently required improved performance as well as excellent pattern characteristics. Particularly, high color reproducibility and high luminance and high contrast ratio characteristics are urgently required. An image sensor is a part for photographing images in a portable phone camera or DSC (a digital still camera). It may be classified as a charge-coupled device (CCD) image sensor and a complementary metal oxide semiconductor (CMOS) image sensor depending upon the manufacturing process and the application method. A color imaging device for a charge-coupled device image sensor or a complementary metal oxide semiconductor image sensor includes color filters each having filter segments of mixing primary color of red, green, and blue, and the colors are separated. A recent color filter mounted in the color imaging device has a pattern size of 2 μm or less, which is 1/100th to 1/200th of the pattern size of a conventional color filter pattern for LCDs. Accordingly, increased resolution and decreased pattern residues are important factors for determining the performance of a device. A color filter manufactured by using a conventional pigment-type photosensitive resin composition has a limit in luminance and a contrast ratio due to the size of pigment particles. In addition, a color imaging device for an image sensor needs a smaller dispersion particle diameter for forming a fine pattern. In order to correspond to the requirements, an attempt to realize a color filter having improved luminance and a contrast ratio has been made by introducing a dye forming no particle instead of the pigment to prepare a photosensitive resin composition appropriate for the dye. However, a dye has inferior durability such as light resistance and heat resistance, and the like to a pigment and thus luminance may be deteriorated.

SUMMARY OF THE INVENTION

An embodiment provides a core-shell dye having improved luminance and contrast ratio.

Another embodiment provides a photosensitive resin composition including the core-shell dye.

Yet another embodiment provides a color filter manufactured using the photosensitive resin composition.

An embodiment provides a core-shell dye includes a core including a compound represented by Chemical Formula 1; and a shell surrounding the core and represented by Chemical Formula 2 or Chemical Formula 3.

[Chemical Formula 1]

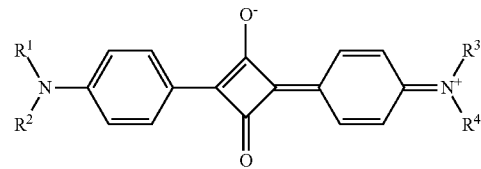

(In Chemical Formula 1,
$R^1$ to $R^4$ are independently a substituted or unsubstituted C1 to C20 alkyl group, a substituted or unsubstituted C3 to C20 cycloalkyl group or a substituted or unsubstituted C6 to C20 aryl group)

[Chemical Formula 2]

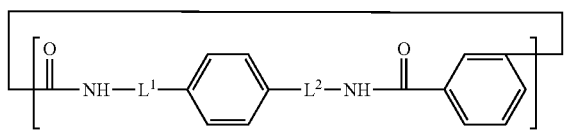

[Chemical Formula 3]

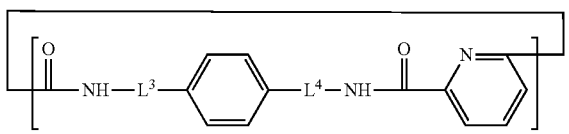

(In Chemical Formula 2 and Chemical Formula 3,
$L^1$ to $L^4$ are independently a single bond or a substituted or unsubstituted C1 to C10 alkylene group)

BRIEF DESCRIPTION OF THE DRAWING

FIG. 1 is a view showing a cage width of a shell represented by Chemical Formula 3-1.

DETAILED DESCRIPTION

Hereinafter, embodiments of the present invention are described in detail. However, these embodiments are exemplary, the present invention is not limited thereto and the present invention is defined by the scope of claims.

In the present specification, when specific definition is not otherwise provided, "substituted" refers to replacement of at least one hydrogen atom of a compound by a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof.

In the present specification, when specific definition is not otherwise provided, a "heterocycloalkyl group", a "heterocycloalkenyl group", a "heterocycloalkynyl group," and a "heterocycloalkylene group" refer to each cyclic compound of cycloalkyl, cycloalkenyl, cycloalkynyl, and cycloalkylene including at least one heteroatom of N, O, S, or P.

In the present specification, when specific definition is not otherwise provided, "(meth)acrylate" refers to both "acrylate" and "methacrylate".

A core-shell dye according to an embodiment may have a structure consisting of a core and a shell surrounding the core. The core may include a compound represented by Chemical Formula 1. Specifically, the shell surrounds the compound represented by Chemical Formula 1 and forms a coating layer.

[Chemical Formula 1]

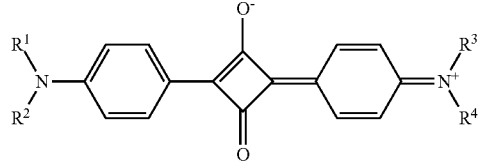

(In Chemical Formula 1,
$R^1$ to $R^4$ are independently a substituted or unsubstituted C1 to C20 alkyl group, a substituted or unsubstituted C3 to C20 cycloalkyl group or a substituted or unsubstituted C6 to C20 aryl group)

The compound represented by Chemical Formula 1 has excellent green spectral characteristics and a high molar extinction coefficient and may be used as a green dye. However, the compound has insufficient durability compared with a pigment and thus may deteriorate luminance during the baking after formed into a color resist. In an embodiment, the compound has a structure that the shell corresponding to a huge cyclic compound surrounds the compound represented by Chemical Formula 1, that is, the compound represented by Chemical Formula 1 is present inside the huge cycle forming the shell and thus may improve durability and resultantly realize a color filter having high luminance and a high contrast ratio.

In Chemical Formula 1, $R^1$ and $R^3$ may independently be a substituted or unsubstituted C1 to C20 alkyl group or a substituted or unsubstituted C3 to C20 cycloalkyl group and $R^2$ and $R^4$ may independently be a C6 to C20 aryl group substituted with a C1 to C10 alkyl group or a C3 to C10 cycloalkyl group. For example, when the $R^2$ and/or $R^4$ is the C6 to C20 aryl group substituted with the C1 to C10 alkyl group, luminance is more improved than when the $R^2$ and/or $R^4$ is a C6 to C20 aryl group substituted with other substituent except the C1 to C10 alkyl group.

The compound represented by Chemical Formula 1 has three kinds of resonance structures as shown in the following diagram, but in the present specification, the compound having one kind of a resonance structure and represented by Chemical Formula 1 is shown for convenience. In other words, the compound represented by Chemical Formula 1 may have any one structure of the three resonance structures.

[Diagram]

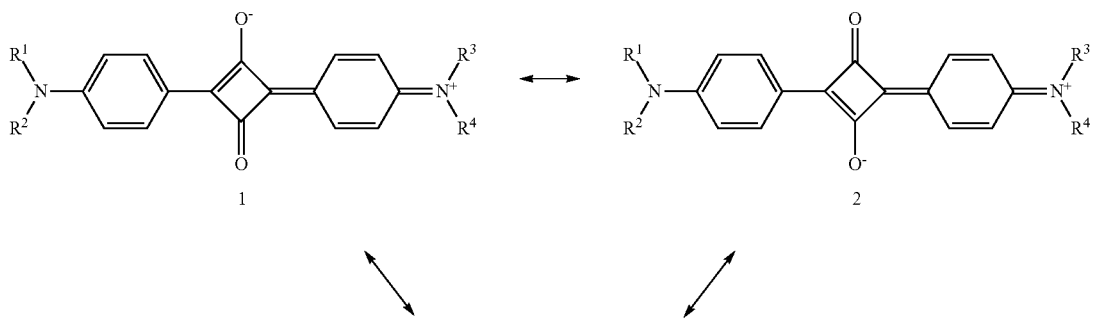

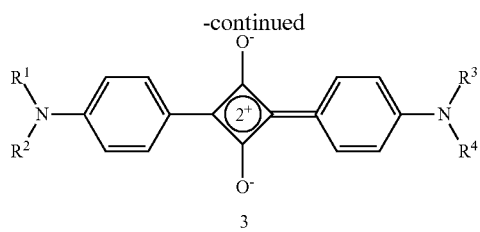
The compound represented by Chemical Formula 1 may be selected from compounds represented by Chemical Formula 1-1 to Chemical Formula 1-8.
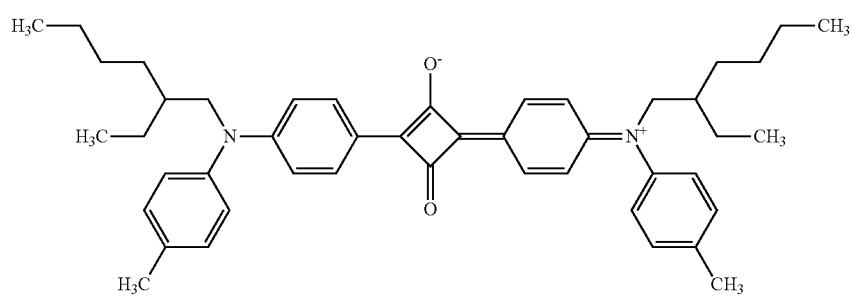
[Chemical Formula 1-1]
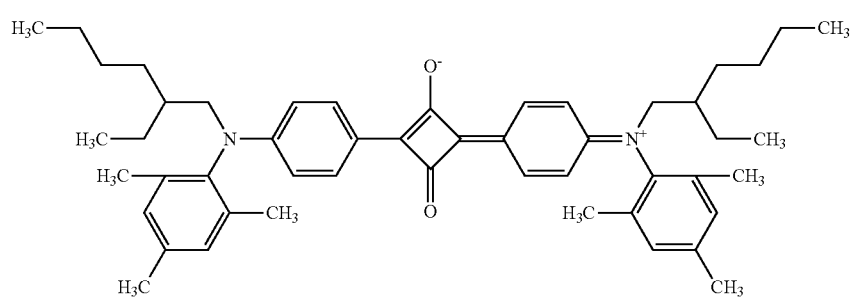
[Chemical Formula 1-2]
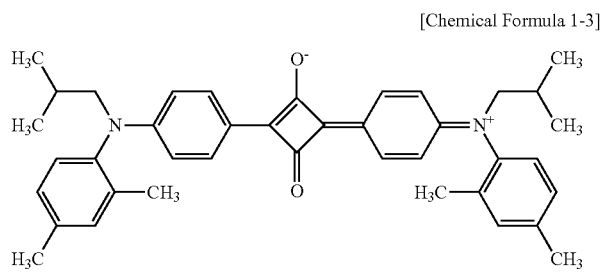
[Chemical Formula 1-3]
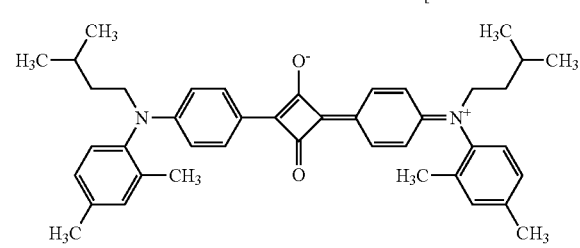
[Chemical Formula 1-4]
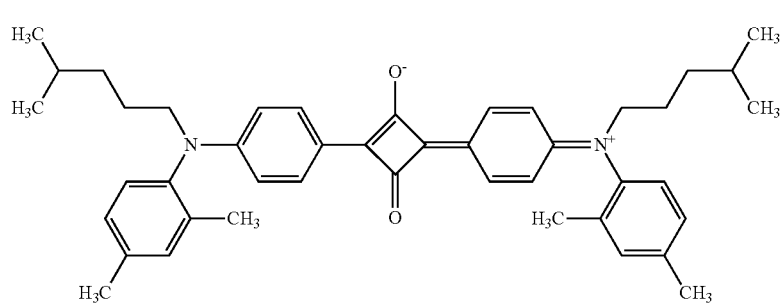
[Chemical Formula 1-5]

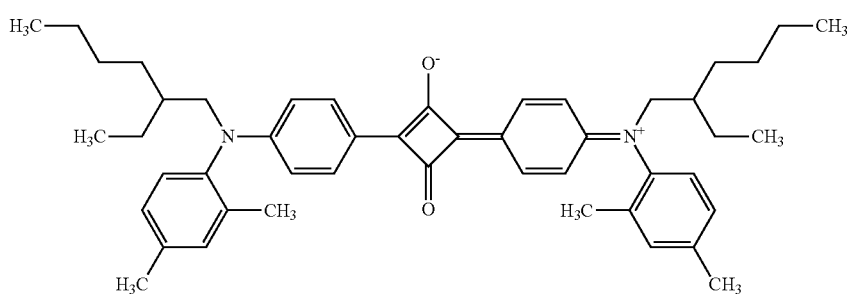
[Chemical Formula 1-6]

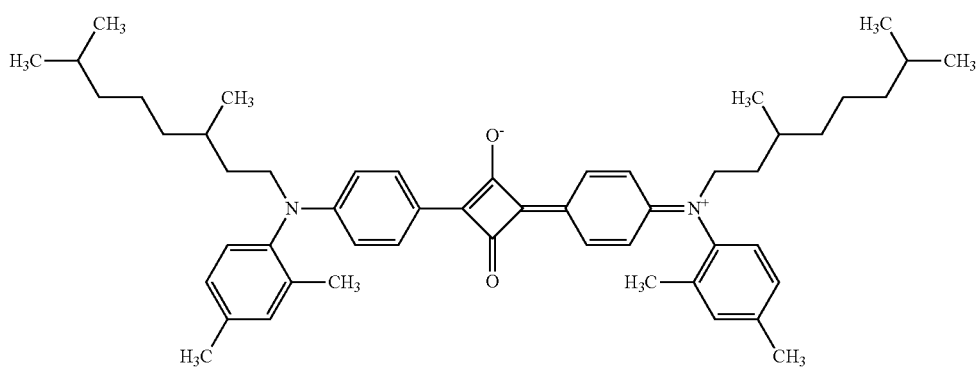
[Chemical Formula 1-7]

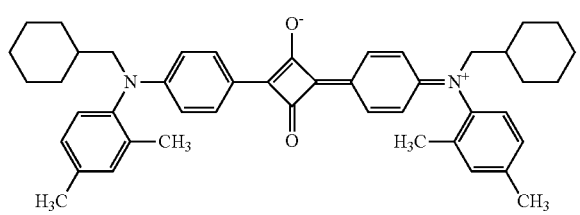
[Chemical Formula 1-8]

A length of the compound represented by Chemical Formula 1 may be 1 nm to 3 nm, for example, 1.5 nm to 2 nm. When the compound represented by Chemical Formula 1 has a length within the range, a core-shell dye may have a structure that a shell surrounds a core. In other words, the compound represented by Chemical Formula 1 has a length within the range and thus may have a structure that the shell surrounds the compound represented by Chemical Formula 1. When a compound having a length out of the range is used, the structure that the shell does not surround the core compound may not be obtained, and durability may not be improved.

The compound represented by Chemical Formula 1 may have a maximum absorption peak in a wavelength of 530 nm to 680 nm. The compound represented by Chemical Formula 1 having the spectral characteristics is used as a dye, for example a green dye and thereby a photosensitive resin composition for a color filter having high luminance and high contrast ratio may be obtained.

When the compound represented by Chemical Formula 1 is used to prepare a photosensitive resin composition, solubility in a post-described solvent may be greater than or equal to 5, for example, range from 5 to 10. The solubility may be obtained by an amount (g) of the dye (compound) dissolved in 100 g of the solvent. When the dye has solubility within the range, compatibility and coloring strength with other components in the photosensitive resin composition, that is, post-described binder resin, photopolymerizable monomer, and photopolymerization initiator may be secured, and precipitation of the dye may be prevented.

The compound represented by Chemical Formula 1 may have excellent heat resistance. That is, a thermal decomposition temperature measured using a thermogravimetric analyzer (TGA) may greater than or equal to 200° C., for example, 200° C. to 300° C.

The shell surrounding the core including the compound represented by Chemical Formula 1 may be represented by Chemical Formula 2 or Chemical Formula 3.

[Chemical Formula 2]

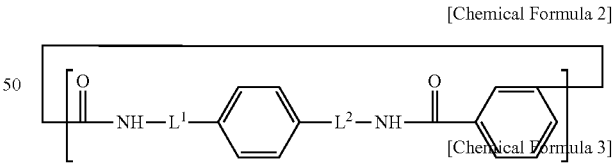

[Chemical Formula 3]

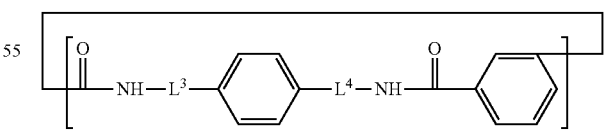

(In Chemical Formula 2 and Chemical Formula 3,
$L^1$ to $L^4$ are independently a single bond or a substituted or unsubstituted C1 to C10 alkylene group)

In Chemical Formula 2 and Chemical Formula 3, $L^1$ to $L^4$ may independently be a substituted or unsubstituted C1 to C10 alkylene group. In this case, a structure having improved solubility where a shell surrounds the core including the compound represented by Chemical Formula 1 is easily formed.

For example, the core-shell dye according to an embodiment includes a non-covalent bond, that is, a hydrogen bond between an oxygen atom of the compound represented by Chemical Formula 1 and a nitrogen atom of the shell represented by Chemical Formula 2 or Chemical Formula 3.

The shell may be for example represented by Chemical Formula 2-1 or Chemical Formula 3-1.

[Chemical Formula 2-1]

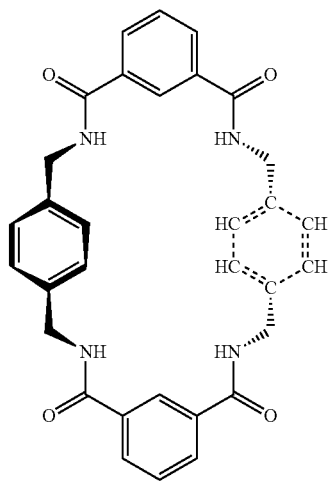

[Chemical Formula 3-1]

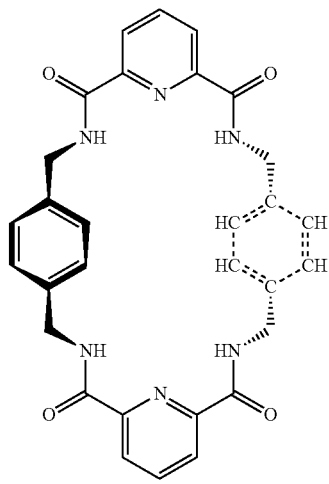

A cage width of the shell may range from 6.5 Å to 7.5 Å and a volume of the shell may range from 10 Å to 16 Å. The cage width in this disclosure refers to an internal distance of the shell, for example in a shell represented by Chemical Formula 2-1 or Chemical Formula 3-1, a distance between two different phenylene groups in which both methylene groups are linked with each other (See FIG. 1). When the shell has a cage width within the range, a core-shell dye having a structure surrounding the core including the compound represented by Chemical Formula 1 may be obtained, and thus a color filter having improved durability and high luminance may be realized when the core-shell dye is added to a photosensitive resin composition.

The core-shell dye includes the core including the compound represented by Chemical Formula 1 and the shell in a mole ratio of 1:1. Within the mole ratio, a shell surrounding the core including the compound represented by Chemical Formula 1, that is a coating layer may be formed well.

For example, the core-shell dye may be represented by one selected from compounds represented by Chemical Formula 4 to Chemical Formula 19, but is not limited thereto.

[Chemical Formula 4]

[Chemical Formula 4]

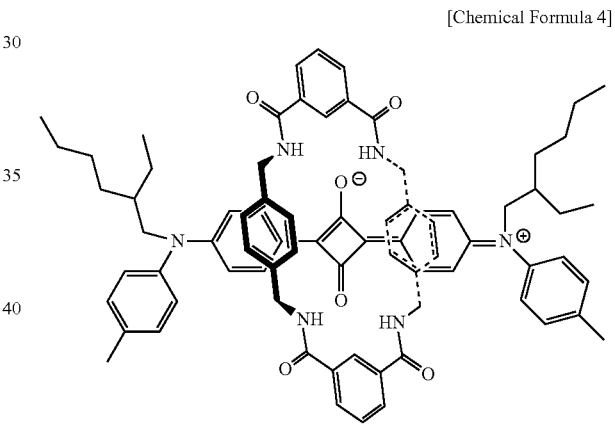

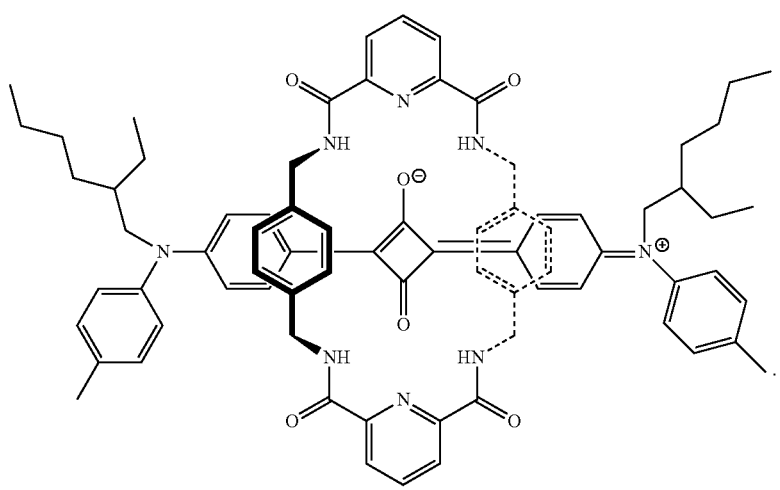

11  12
[Chemical Formula 6]
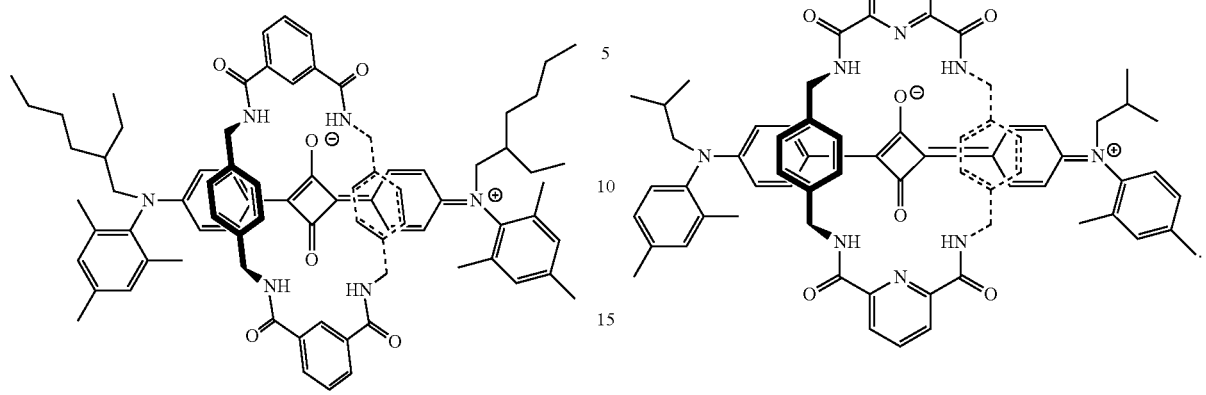
[Chemical Formula 7]
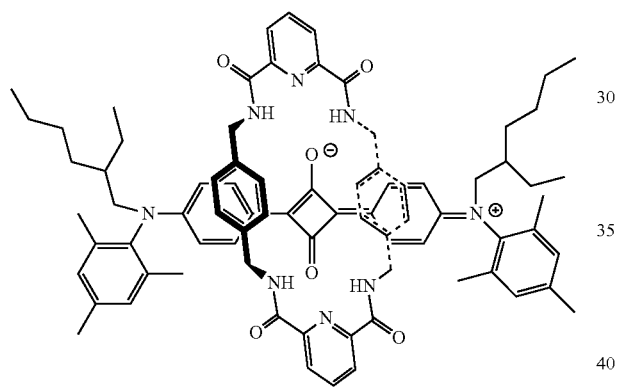
[Chemical Formula 8]
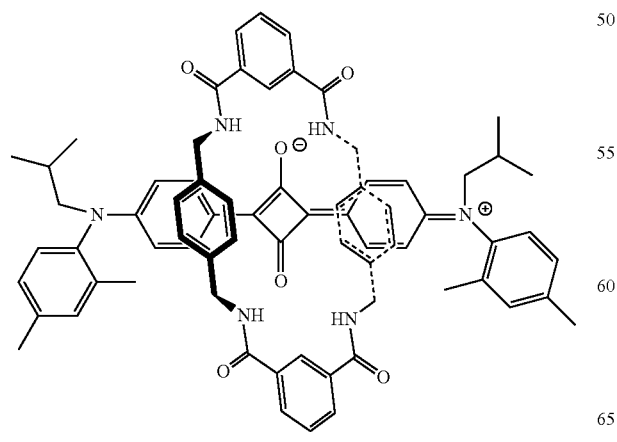
[Chemical Formula 10]
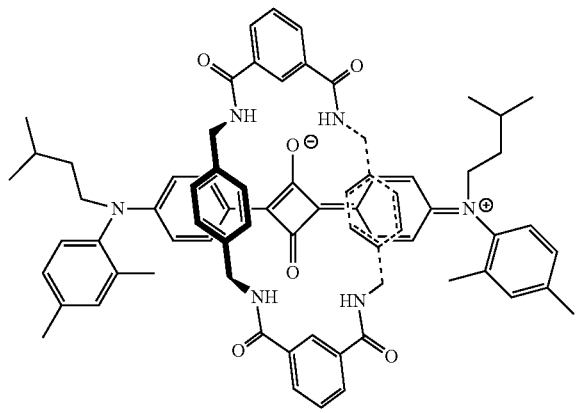

[Chemical Formula 11]
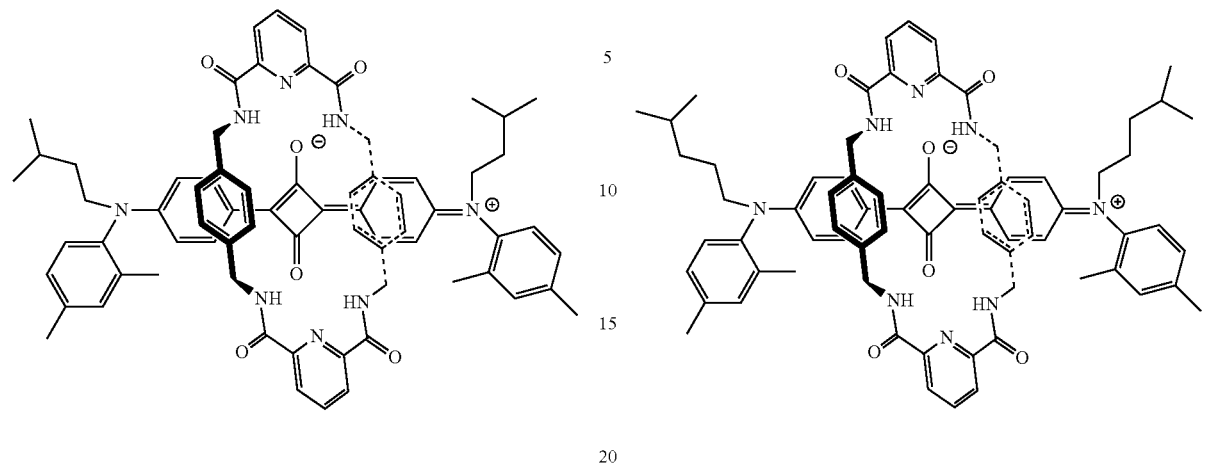
[Chemical Formula 13]
[Chemical Formula 12]
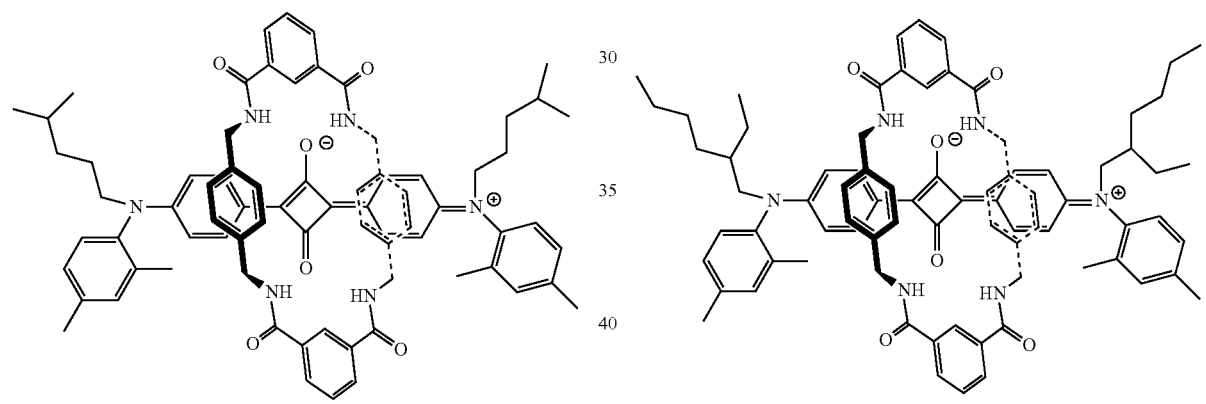
[Chemical Formula 14]
[Chemical Formula 15]
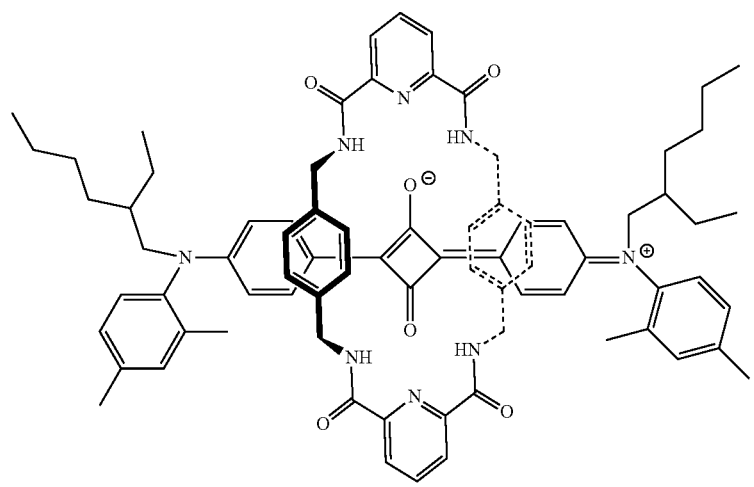

[Chemical Formula 16]
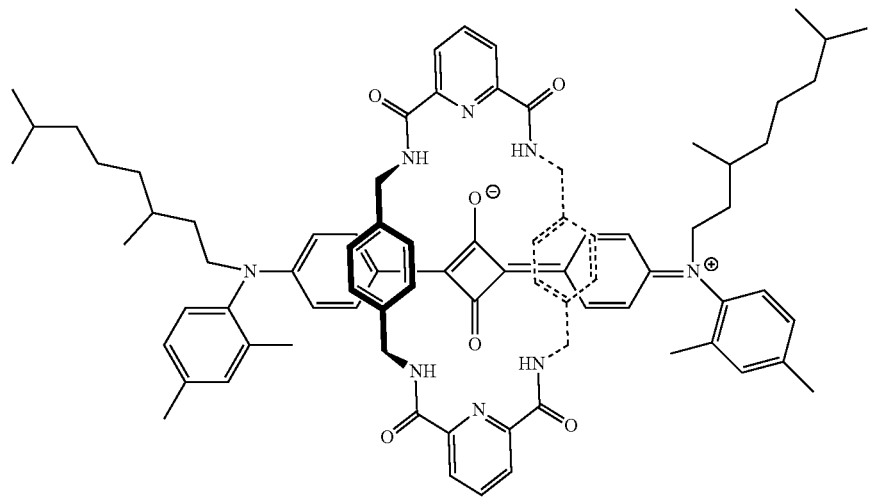
[Chemical Formula 17]
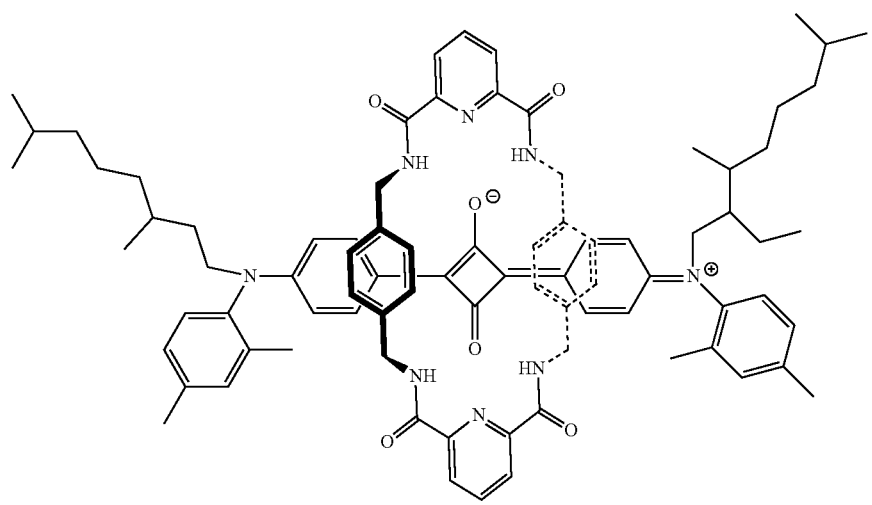
[Chemical Formula 18]
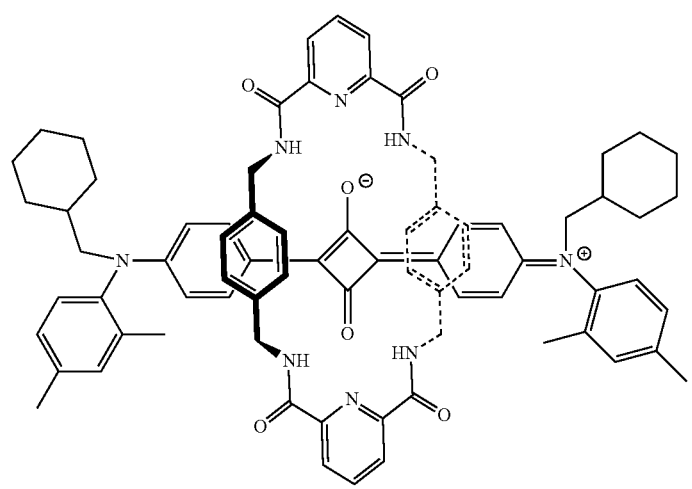

[Chemical Formula 19]

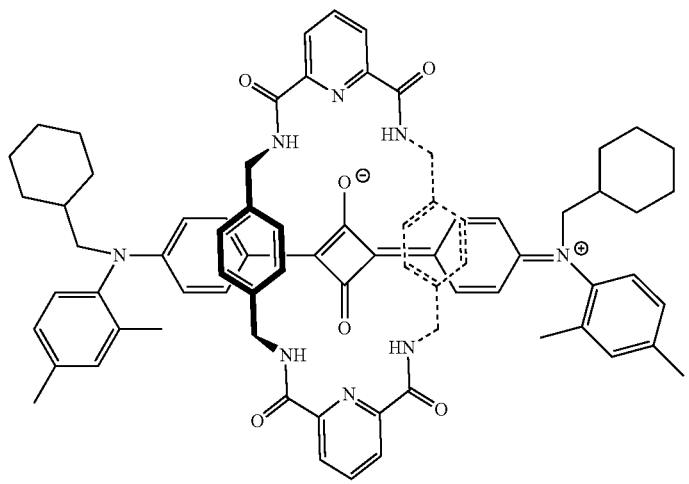

The core-shell dye may be used alone as a green dye and may be mixed with an auxiliary dye.

The auxiliary dye may be a triarylmethane-based dye, an anthraquinone-based dye, a benzylidene-based dye, a cyanine-based dye, phthalocyanine-based dye, an azaporphyrin-based dye, an indigo-based dye, a xanthene-based dye, and the like.

The core-shell dye may be mixed with a pigment.

The pigment may be a red pigment, a green pigment, a blue pigment, a yellow pigment, a black pigment, and the like.

Examples of the red pigment may be C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment may be C.I. green pigment 36, C.I. green pigment 7, C.I. green pigment 58, C.I. green pigment 59, C.I. green pigment 62 and the like. Examples of the blue pigment may be a copper phthalocyanine pigment such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. Examples of the yellow pigment may be an isoindoline-based pigment such as C.I. yellow pigment 139, a quinophthalone-based pigment such as C.I. yellow pigment 138, a nickel complex pigment such as C.I. yellow pigment 150, and the like. Examples of the black pigment may be aniline black, perylene black, titanium black, carbon black, and the like. The pigment may be used alone or as a mixture of two or more and is not limited thereto.

The pigment may be included in the photosensitive resin composition for a color filter in a pigment dispersion liquid state. The pigment dispersion liquid may consist of the pigment and a solvent, a dispersing agent, a disperse resin, and the like.

The solvent may be ethylene glycol acetate, ethyl cellosolve, propylene glycol methyl ether acetate, ethyl lactate, polyethylene glycol, cyclohexanone, propylene glycol methyl ether, and the like, and preferably propylene glycol methyl ether acetate.

The dispersing agent helps uniform dispersion of the pigment, and may include a non-ionic, anionic, or cationic dispersing agent. Specific examples may be polyalkylene glycol or esters thereof, polyoxy alkylene, polyhydric alcohol ester alkylene oxide addition products, alcohol alkylene oxide addition products, sulfonate esters, sulfonate salts, carboxylate esters, carboxylate salts, alkyl amide alkylene oxide addition products, alkyl amines, and may be used singularly or as a mixture of two or more.

The disperse resin may be an acryl-based resin including a carboxyl group, and improves stability of the pigment dispersion liquid and pattern properties of a pixel.

The core-shell dye and the pigment may be mixed in a weight ratio of 1:9 to 9:1 and specifically in a weight ratio of 3:7 to 7:3. When they are mixed within the weight ratio range, high luminance and contrast ratios may be obtained while color characteristics are maintained.

According to another embodiment, a photosensitive resin composition including the core-shell dye is provided.

The photosensitive resin composition includes (A) a core-shell dye, (B) a binder resin, (C) a photopolymerizable monomer, (D) a photopolymerization initiator, and (E) a solvent.

Hereinafter each component is specifically described.

(A) Core-Shell Dye

The core-shell dye is the same as described above.

The core-shell dye may be included in an amount of 0.5 wt % to 10 wt %, for example 0.5 wt % to 5 wt % based on a total amount of the photosensitive resin composition for a color filter. When the core-shell dye is used within the range, high luminance and a high contrast ratio at a desirable color coordinate may be realized.

(B) Binder Resin

The binder resin is a copolymer of a first ethylenic unsaturated monomer and a second ethylenic unsaturated monomer that is copolymerizable therewith, and is resin including at least one acryl-based repeating unit.

The first ethylenic unsaturated monomer is an ethylenic unsaturated monomer including at least one carboxyl group. Examples of the monomer include (meth)acrylic acid, maleic acid, itaconic acid, fumaric acid, or a combination thereof.

The first ethylenic unsaturated monomer may be included in an amount of 5 wt % to 50 wt %, for example 10 wt % to 40 wt % based on a total amount of the binder resin.

The second ethylenic unsaturated monomer may be an aromatic vinyl compound such as styrene, α-methylstyrene, vinyl toluene, vinylbenzylmethylether and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated amino alkyl carboxylate ester compound such as 2-aminoethyl(meth)acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl(meth)acrylate, and the like; a vinyl cyanide compound such as (meth) acrylonitrile and the like; an unsaturated amide compound such as (meth)acrylamide, and the like; and the like, and may be used alone or as a mixture of two or more.

Specific examples of the binder resin may be a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer and the like, but are not limited thereto. These may be used alone or as a mixture of two or more.

A weight average molecular weight of the binder resin may be 3,000 g/mol to 150,000 g/mol, for example 5,000 g/mol to 50,000 g/mol, for example 20,000 g/mol to 30,000 g/mol. When the binder resin has a weight average molecular weight within the range, close contacting properties with a substrate and physicochemical properties are improved and viscosity is appropriate.

An acid value of the binder resin may be 15 mgKOH/g to 60 mgKOH/g, for example 20 mgKOH/g to 50 mgKOH/g. When the binder resin has an acid value within the range, excellent resolution of a pixel may be obtained.

The binder resin may be included in an amount of 0.1 wt % to 30 wt %, for example 5 wt % to 20 wt % based on a total amount the photosensitive resin composition. When the binder resin is included within the above range, developability may be improved and excellent surface smoothness may be improved due to improved cross-linking during the manufacture of a color filter.

(C) Photopolymerizable Monomer

The photopolymerizable monomer may be a mono-functional or multi-functional ester of (meth)acrylic acid including at least one ethylenic unsaturated double bond.

The photopolymerizable monomer may cause sufficient polymerization during exposure in a pattern-forming process and form a pattern having excellent heat resistance, light resistance, and chemical resistance due to the ethylenic unsaturated double bond.

Specific examples of the photopolymerizable monomer may be ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth) acrylate, dipentaerythritol di(meth)acrylate, dipentaerythritol tri(meth)acrylate, dipentaerythritol penta (meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable monomer may be as follows. The mono-functional (meth)acrylic acid ester may include Aronix M-101®, M-111®, M-114° (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth) acrylic acid ester may include Aronix M-309®, M-400®, M-405®, M-450®, M-7100®, M-8030®, M-8060® (Toagosei Chemistry Industry Co., Ltd.); KAYARAD TMPTA®, DPCA-20®, DPCA-30®, DPCA-60®, DPCA-120® (Nippon Kayaku Co., Ltd.); V-295®, V-300®, V-360®, V-GPT®, V-3PA®, V-400° (Osaka Yuki Kayaku Kogyo Co. Ltd.), and the like. These may be used alone or as a mixture of two or more.

The photopolymerizable monomer may be treated with acid anhydride to improve developability.

The photopolymerizable monomer may be included in an amount of 0.1 wt % to 30 wt %, for example 5 wt % to 20 wt % based on a total amount of the photosensitive resin composition. When the photopolymerizable monomer is included within the range, pattern characteristic and developability during manufacture of a color filter may be improved.

(D) Photopolymerization Initiator

The photopolymerization initiator may be an acetophenone-based compound, a benzophenone-based compound, a thioxanthone-based compound, a benzoin-based compound, a triazine-based compound, an oxime-based compound, and the like.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphtho-1-yl)-4,6-bis (trichloromethyl)-s-triazine, 2-(4-methoxynaphtho-1-yl)-4, 6-bis(trichloromethyl)-s-triazine, 2-4-tri chloromethyl (piperonyl)-6-triazine, 2-4-trichloromethyl (4'-methoxystyryl)-6-triazine, and the like.

Examples of the oxime-based compound may be 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like.

The photopolymerization initiator may further include a carbazole-based compound, a diketone-based compound, a sulfonium borate-based compound, a diazo-based compound, an imidazole-based compound, a biimidazole-based compound, a fluorene-based compound, and the like in addition to the compounds.

The photopolymerization initiator may be included in an amount of 0.1 wt % to 5 wt %, for example 1 wt % to 3 wt % based on a total amount of the photosensitive resin composition. When the photopolymerization initiator is included within the range, the composition may be sufficiently photopolymerized when exposed to light during the pattern-forming process for preparing a color filter, accomplishing excellent sensitivity and improving transmittance.

(E) Solvent

The solvent is not particularly limited and specifically for example, alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; or ketonate esters such as ethyl pyruvate, and the like, and additionally N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, which may be used alone or as a mixture of two or more.

Considering miscibility and reactivity, the solvent may desirably be glycol ethers such as ethylene glycol monoethyl ether, and the like; ethylene glycol alkylether acetates such as ethyl cellosolve acetate, and the like; esters such as 2-hydroxyethyl propionate, and the like; diethylene glycols such as diethylene glycol monomethyl ether, and the like; propylene glycol alkylether acetates such as propylene glycol monomethylether acetate, propylene glycol propylether acetate, and the like.

The solvent is used in a balance amount, and specifically 20 wt % to 90 wt % based on a total amount of the photosensitive resin composition. The photosensitive resin composition for a color filter has a coating property, and may maintain excellent flatness of a film having a thickness of 3 μm or more.

(F) Other Additive

The photosensitive resin composition may further include an additive such as malonic acid; 3-amino-1,2-propanediol; a silane-based coupling agent including a vinyl group or a (meth)acryloxy group; a leveling agent; a fluorine-based surfactant; a radical polymerization initiator, and the like in order to prevent stains or spots during the coating, to adjust leveling, or to prevent pattern residue due to non-development.

In addition, the photosensitive resin composition may further include an additive such as an epoxy compound, and the like in order to improve a close contacting property with a substrate.

Examples of the epoxy compound may be a phenol novolac epoxy compound, a tetramethyl biphenyl epoxy compound, a bisphenol A epoxy compound, an alicyclic epoxy compound, or a combination thereof.

An amount of the additive may be controlled according to desirable properties.

Another embodiment provides a color filter manufactured using the photosensitive resin composition is provided. A method of manufacturing the color filter is as follows.

The photosensitive resin composition is coated on a bare glass substrate, or on a glass substrate on which $SiN_x$ is coated in a thickness of 500 Å to 1500 Å as a protective layer using an appropriate method of spin-coating, slit-coating, and the like to have a thickness of 3.1 μm to 3.4 μm. After the coating, light is irradiated to form a pattern required for a color filter. After irradiation, the coated layer is treated with an alkali developing solution, and a non-radiated region of the coated layer may be dissolved, forming a pattern for an image color filter. This process is repeated depending on the necessary number of R, G, and B colors, fabricating a color filter having a desired pattern.

In addition, the image pattern acquired by the development is cured through heat treatment, actinic ray radiation, or the like, resultantly improving crack resistance, solvent resistance, and the like.

Hereinafter, the present invention is preferably in more detail with reference to examples. These examples, however, are not in any sense to be interpreted as limiting the scope of the invention.

(Preparation of Core-Shell Dye)

Synthesis Example 1: Synthesis of Intermediate A-1

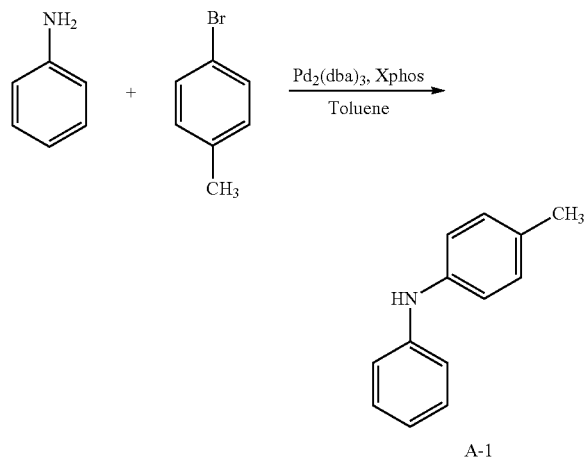

A-1

Aniline (10 mol), 4-bromotoluene (10 mol), Pd$_2$(dba)$_3$ (0.1 mol), and Xphos (0.1 mol) were put in toluene and then, heated at 100° C. and stirred for 24 hours. Ethyl acetate was added to the solution, and the mixture was twice cleaned to extract an organic layer. The extracted organic layer was distilled under a reduced pressure and purified to obtain Intermediate A-1.

Synthesis Example 2: Synthesis of Intermediate A-2

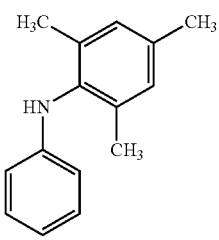

A-2

Intermediate A-2 was obtained according to the same method as Synthesis Example 1 except for using bromo mesitylene instead of 4-bromotoluene.

Synthesis Example 3: Synthesis of Intermediate B-1

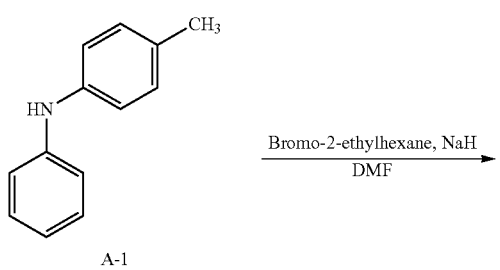

A-1

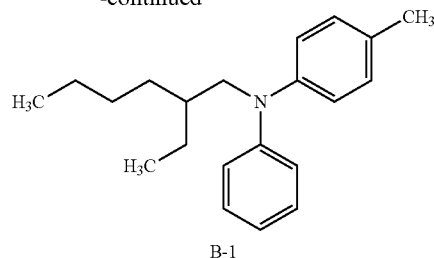

B-1

Intermediate A-1, bromo-2-ethylhexane, and sodium hydride were put in N,N-dimethyl formamide and then, heated up to 80° C. and stirred for 24 hours. Ethyl acetate was added to the solution, and the mixture is twice cleaned to extract an organic layer. The extracted organic layer was distilled under a reduced pressure and separated through column chromatography to obtain Intermediate B-1.

Synthesis Example 4: Synthesis of Intermediate B-2

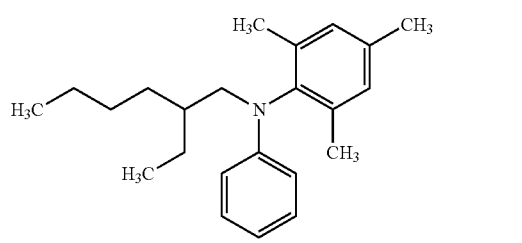

B-2

Intermediate B-2 was obtained according to the same method as Synthesis Example 3 except for using Intermediate A-2 instead of Intermediate A-1.

Synthesis Example 5: Synthesis of Intermediate C-1

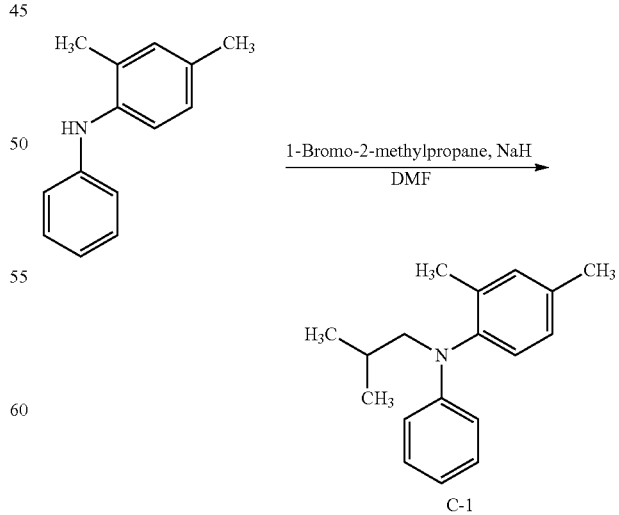

C-1

2,4-dimethyldiphenylamine (10 mol), 1-bromo-2-methylpropane (10 mol), and sodium hydride (10 mol) were put in N,N-dimethyl formamide and then, heated up to 80° C. and stirred for 24 hours. Ethyl acetate was added to the solution, and the mixture was twice cleaned to extract an organic layer. The organic layer was distillated under a reduced pressure and separated through column chromatography to obtain Intermediate C-1.

Synthesis Example 6: Synthesis of Intermediate C-2

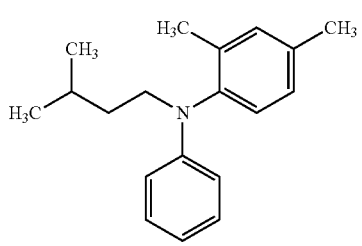

C-2

Intermediate C-2 was obtained according to the same method as Synthesis Example 5 except for using 1-bromo-3-methylbutane instead of 1-bromo-2-methylpropane.

Synthesis Example 7: Synthesis of Intermediate C-3

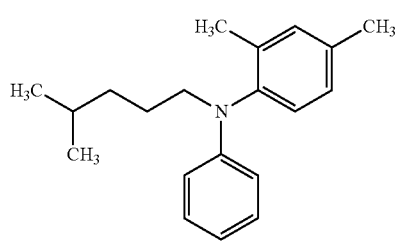

C-3

Intermediate C-3 was obtained according to the same method as Synthesis Example 5 except for using 1-bromo-4-methylpentane instead of 1-bromo-2-methylpropane.

Synthesis Example 8: Synthesis of Intermediate C-4

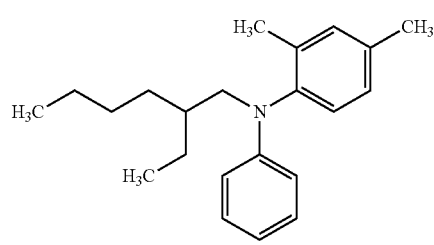

C-4

Intermediate C-4 was obtained according to the same method as Synthesis Example 5 except for using 1-bromo-2-ethylhexane instead of 1-bromo-2-methylpropane.

Synthesis Example 9: Synthesis of Intermediate C-5

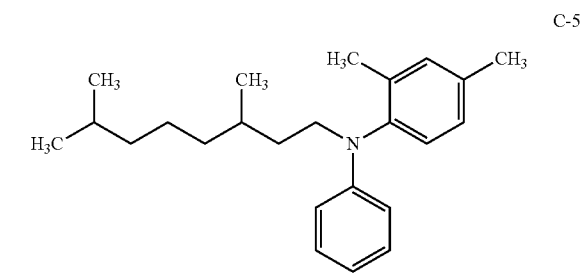 [SMILES: Cc1ccc(N(CCC(C)CCCC(C)C)c2ccccc2)c(C)c1]

C-5

Intermediate C-5 was obtained according to the same method as Synthesis Example 5 except for using 1-bromo-3,7-dimethyloctane instead of 1-bromo-2-methylpropane.

Synthesis Example 10: Synthesis of Intermediate C-6

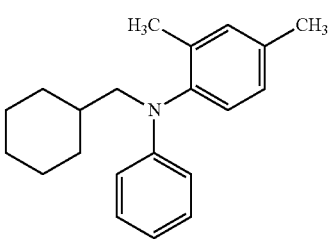

C-6

Intermediate C-6 was obtained according to the same method as Synthesis Example 5 except for using (bromomethyl)cyclohexane instead of 1-bromo-2-methylpropane.

Synthesis Example 11: Synthesis of Compound Represented by Chemical Formula 1-1

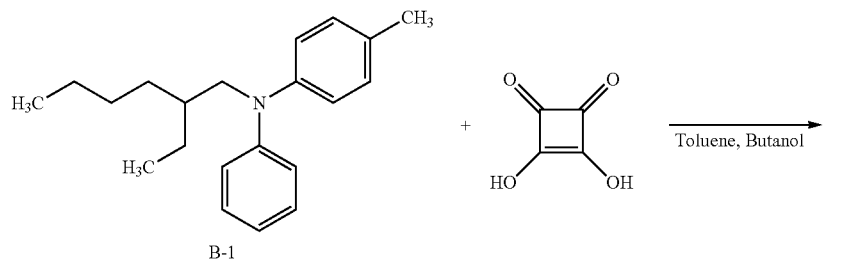

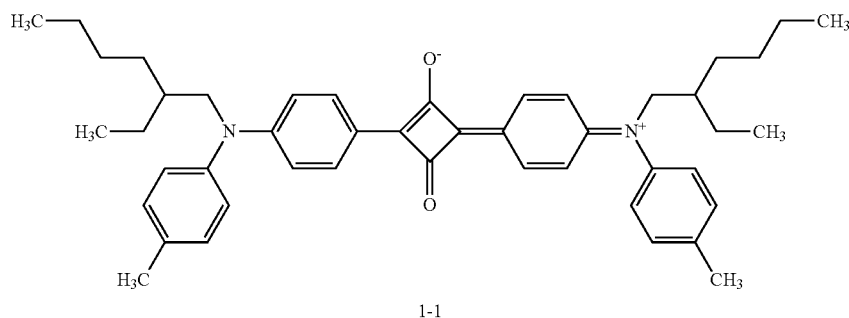

Intermediate B-1 (60 mmol) and 3,4-dihydroxy-3-cyclobutene-1,2-dione (30 mmol) were put in toluene (200 mL) and butanol (200 mL), and water produced by refluxing the mixture was removed with a Dean-Stark distillatory. After stirring the resultant for 12 hours, the green reactant was distillated under a reduced pressure and purified through column chromatography to obtain a compound represented by Chemical Formula 1-1.

Synthesis Example 12: Synthesis of Compound Represented by Chemical Formula 1-2

A compound represented by Chemical Formula 1-2 was synthesized according to the same method as Synthesis Example 11 except for using Intermediate B-2 instead of Intermediate B-1.

Synthesis Example 13: Synthesis of Compound Represented by Chemical Formula 1-3

A compound represented by Chemical Formula 1-3 was synthesized according to the same method as Synthesis Example 11 except for using Intermediate C-1 instead of Intermediate B-1.

Synthesis Example 14: Synthesis of Compound Represented by Chemical Formula 1-4

A compound represented by Chemical Formula 1-4 was synthesized according to the same method as Synthesis Example 11 except for using Intermediate C-2 instead of Intermediate B-1.

Synthesis Example 15: Synthesis of Compound Represented by Chemical Formula 1-5

A compound represented by Chemical Formula 1-5 was synthesized according to the same method as Synthesis Example 11 except for using Intermediate C-3 instead of Intermediate B-1.

Synthesis Example 16: Synthesis of Compound Represented by Chemical Formula 1-6

A compound represented by Chemical Formula 1-6 was synthesized according to the same method as Synthesis Example 11 except for using Intermediate C-4 instead of Intermediate B-1.

Synthesis Example 17: Synthesis of Compound Represented by Chemical Formula 1-7

A compound represented by Chemical Formula 1-7 was synthesized according to the same method as Synthesis Example 11 except for using Intermediate C-5 instead of Intermediate B-1.

Synthesis Example 18: Synthesis of Compound Represented by Chemical Formula 1-8

A compound represented by Chemical Formula 1-8 was synthesized according to the same method as Synthesis Example 11 except for using Intermediate C-6 instead of Intermediate B-1.

Synthesis Example 19: Synthesis of Core-Shell Dye Represented by Chemical Formula 4

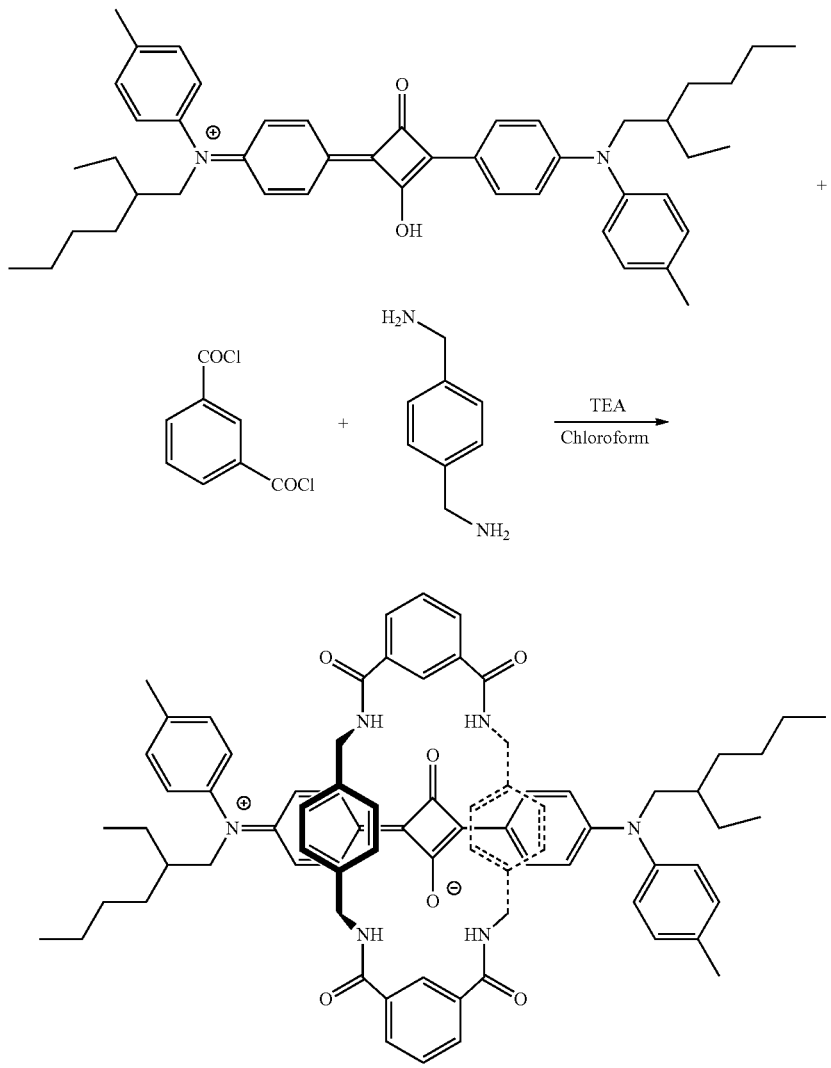

The compound represented by Chemical Formula 1-1 (5 mmol) was dissolved in a chloroform solvent (600 mL), and a solution obtained by dissolving isophthaloyl chloride (20 mmol) and p-xylylenediamine (20 mmol) in chloroform (60 mL) was added thereto in a dropwise fashion at room temperature for 5 hours. After 12 hours, the mixture was distillated under a reduced pressure and separated through column chromatography to obtain a compound represented by Chemical Formula 4.

Maldi-tof MS: 1200.65 m/z

Synthesis Example 20: Synthesis of Core-Shell Dye Represented by Chemical Formula 5

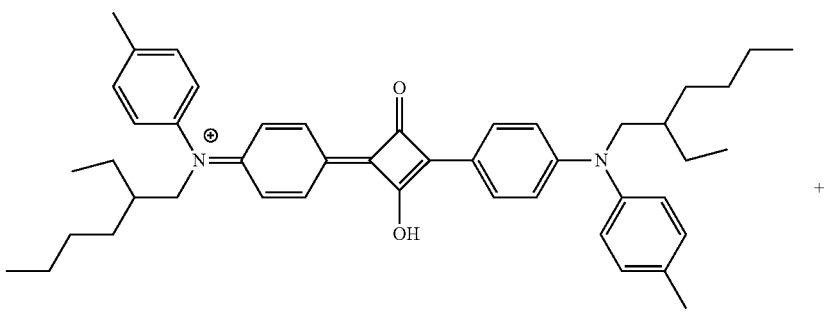

-continued

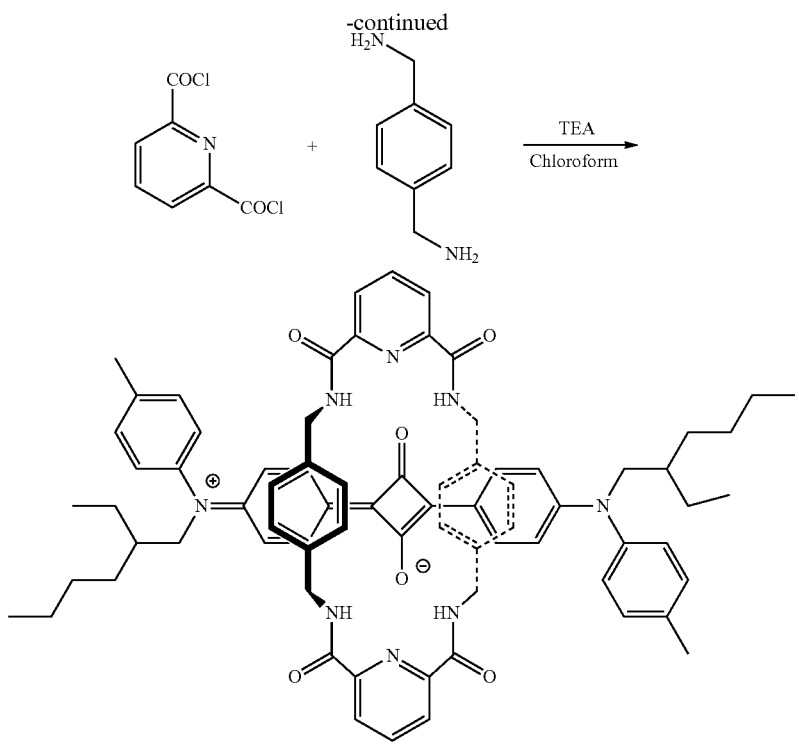

The compound represented by Chemical Formula 1-1 (5 mmol) was dissolved in a chloroform solvent (600 mL), and triethylamine (50 mmol) was added thereto. 2,6-pyridinedicarbonyl dichloride (20 mmol) and p-xylylenediamine (20 mmol) were dissolved in chloroform (60 mL), and the solution was added in a dropwise fashion thereto at room temperature for 5 hours. After 12 hours, the mixture was distillated under a reduced pressure and separated through column chromatography to obtain a compound represented by Chemical Formula 5.

Maldi-tof MS: 1203.64 m/z

Synthesis Example 21: Synthesis of Core-Shell Dye Represented by Chemical Formula 6

A compound represented by Chemical Formula 6 was obtained according to the same method as Synthesis Example 19 except for using the compound represented by Chemical Formula 1-2 instead of the compound represented by Chemical Formula 1-1.

Maldi-tof MS: 1256.71 m/z

Synthesis Example 22: Synthesis of Core-Shell Dye Represented by Chemical Formula 7

A compound represented by Chemical Formula 7 was obtained according to the same method as Synthesis Example 20 except for using the compound represented by Chemical Formula 1-2 instead of the compound represented by Chemical Formula 1-1.

Maldi-tof MS: 1258.70 m/z

Synthesis Example 23: Synthesis of Core-Shell Dye Represented by Chemical Formula 8

A compound represented by Chemical Formula 8 was obtained according to the same method as Synthesis Example 19 except for using the compound represented by Chemical Formula 1-3 instead of the compound represented by Chemical Formula 1-1.

Maldi-tof MS: 1116.56 m/z

Synthesis Example 24: Synthesis of Core-Shell Dye Represented by Chemical Formula 9

A compound represented by Chemical Formula 9 was obtained according to the same method as Synthesis Example 20 except for using the compound represented by Chemical Formula 1-3 instead of the compound represented by Chemical Formula 1-1.

Maldi-tof MS: 1118.54 m/z

Synthesis Example 25: Synthesis of Core-Shell Dye Represented by Chemical Formula 10

A compound represented by Chemical Formula 10 was obtained according to the same method as Synthesis Example 19 except for using the compound represented by Chemical Formula 1-4 instead of the compound represented by Chemical Formula 1-1.

Maldi-tof MS: 1144.58 m/z

Synthesis Example 26: Synthesis of Core-Shell Dye Represented by Chemical Formula 11

A compound represented by Chemical Formula 11 was obtained according to the same method as Synthesis Example 20 except for using the compound represented by Chemical Formula 1-4 instead of the compound represented by Chemical Formula 1-1.

Maldi-tof MS: 1146.57 m/z

Synthesis Example 27: Synthesis of Core-Shell Dye Represented by Chemical Formula 12

A compound represented by Chemical Formula 12 was obtained according to the same method as Synthesis Example 19 except for using the compound represented by Chemical Formula 1-5 instead of the compound represented by Chemical Formula 1-1.

Maldi-tof MS: 1172.61 m/z

Synthesis Example 28: Synthesis of Core-Shell Dye Represented by Chemical Formula 13

A compound represented by Chemical Formula 13 was obtained according to the same method as Synthesis Example 20 except for using the compound represented by Chemical Formula 1-5 instead of the compound represented by Chemical Formula 1-1.

Maldi-tof MS: 1174.60 m/z

Synthesis Example 29: Synthesis of Core-shell Dye Represented by Chemical Formula 14

A compound represented by Chemical Formula 14 was obtained according to the same method as Synthesis Example 19 except for using the compound represented by Chemical Formula 1-6 instead of the compound represented by Chemical Formula 1-1.

Maldi-tof MS: 1228.68 m/z

Synthesis Example 30: Synthesis of Core-Shell Dye Represented by Chemical Formula 15

A compound represented by Chemical Formula 15 was obtained according to the same method as Synthesis Example 20 except for using the compound represented by Chemical Formula 1-6 instead of the compound represented by Chemical Formula 1-1.

Maldi-tof MS: 1230.67 m/z

Synthesis Example 31: Synthesis of Core-Shell Dye Represented by Chemical Formula 16

A compound represented by Chemical Formula 16 was obtained according to the same method as Synthesis Example 19 except for using the compound represented by Chemical Formula 1-7 instead of the compound represented by Chemical Formula 1-1.

Maldi-tof MS: 1284.74

Synthesis Example 32: Synthesis of Core-Shell Dye Represented by Chemical Formula 17

A compound represented by Chemical Formula 17 was obtained according to the same method as Synthesis Example 20 except for using the compound represented by Chemical Formula 1-7 instead of the compound represented by Chemical Formula 1-1.

Maldi-tof MS: 1286.73 m/z

Synthesis Example 33: Synthesis of Core-Shell Dye Represented by Chemical Formula 18

A compound represented by Chemical Formula 18 was obtained according to the same method as Synthesis Example 19 except for using the compound represented by Chemical Formula 1-8 instead of the compound represented by Chemical Formula 1-1.

Maldi-tof MS: 1196.61

Synthesis Example 34: Synthesis of Core-Shell Dye Represented by Chemical Formula 19

A compound represented by Chemical Formula 19 was obtained according to the same method as Synthesis Example 20 except for using the compound represented by Chemical Formula 1-8 instead of the compound represented by Chemical Formula 1-1.

Maldi-tof MS: 1198.60 m/z

Synthesis Example 35: Synthesis of Core-Shell Dye

Squaric acid (398 mg) and 2-(3-(dibutylamino)phenoxy)ethyl acrylate (2.23 g) were put in a 100 mL 3-necked flask, n-butanol (40 mL) and toluene (20 mL) were added thereto, and the mixture was heated and refluxed at 120° C. for 5 hours. Water produced during the reaction was removed by using a Dean-Stark trap set, and the reaction was promoted. After the reaction, the resultant was cooled down and extracted with methylene chloride, and an extract therefrom was treated through column chromatography to obtain a compound represented by Chemical Formula X (Yield of 60%). Subsequently, 0.72 g (1 mmol) of the compound represented by Chemical Formula X and 2.02 g (1 mmol) of triacetyl β-cyclodextrin represented by Chemical Formula Y (TCI, CAS #23739-88-0) were dissolved in 50 ml of dichloromethane, the solution was stirred for 12 hours at room temperature, and then, about 2.7 g of a core-shell dye in a solid state was obtained by removing a solvent therefrom and drying the remainder under a reduced pressure. The core-shell dye has a structure that the compound represented by Chemical Formula X is surrounded by the compound represented by Chemical Formula Y.

[Chemical Formula X]

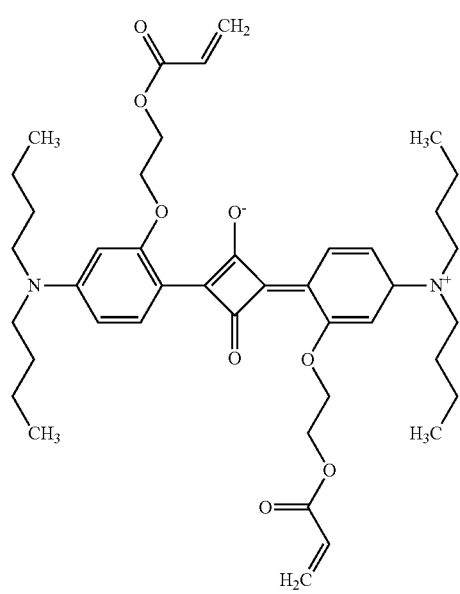

[Chemical Formula Y]

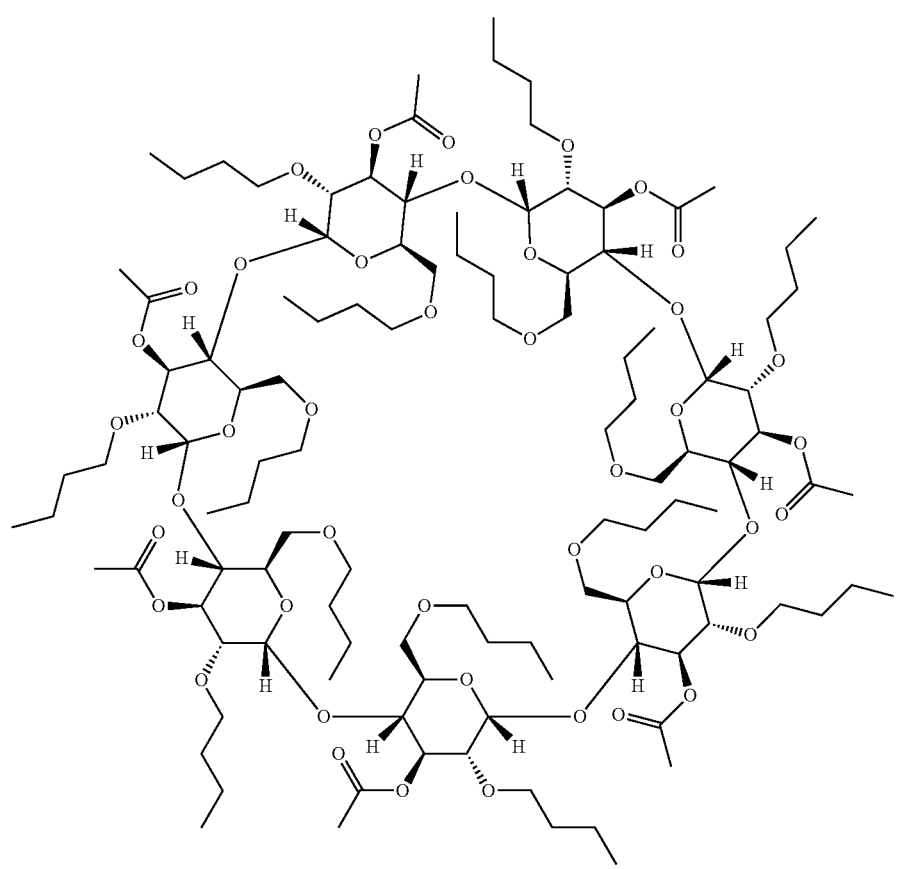

(Preparation of Photosensitive Resin Composition)

Photosensitive resin compositions were prepared using the following components.

(A) Dye
- (A-1) Core-shell dye prepared in Synthesis Example 19 (represented by Chemical Formula 4)
- (A-2) Core-shell dye prepared in Synthesis Example 20 (represented by Chemical Formula 5)
- (A-3) Core-shell dye prepared in Synthesis Example 21 (represented by Chemical Formula 6)
- (A-4) Core-shell dye prepared in Synthesis Example 22 (represented by Chemical Formula 7)
- (A-5) Core-shell dye prepared in Synthesis Example 23 (represented by Chemical Formula 8)
- (A-6) Core-shell dye prepared in Synthesis Example 24 (represented by Chemical Formula 9)

(A-7) Core-shell dye prepared in Synthesis Example 25 (represented by Chemical Formula 10)
(A-8) Core-shell dye prepared in Synthesis Example 26 (represented by Chemical Formula 11)
(A-9) Core-shell dye prepared in Synthesis Example 27 (represented by Chemical Formula 12)
(A-10) Core-shell dye prepared in Synthesis Example 28 (represented by Chemical Formula 13)
(A-11) Core-shell dye prepared in Synthesis Example 29 (represented by Chemical Formula 14)
(A-12) Core-shell dye prepared in Synthesis Example 30 (represented by Chemical Formula 15)
(A-13) Core-shell dye prepared in Synthesis Example 31 (represented by Chemical Formula 16)
(A-14) Core-shell dye prepared in Synthesis Example 32 (represented by Chemical Formula 17)
(A-15) Core-shell dye prepared in Synthesis Example 33 (represented by Chemical Formula 18)
(A-16) Core-shell dye prepared in Synthesis Example 34 (represented by Chemical Formula 19)
(A-17) Core-shell dye prepared in Synthesis Example 35
(A-18) Dye represented by Chemical Formula 1-1
(A-19) Dye represented by Chemical Formula 1-3
(A-20) Dye represented by Chemical Formula 1-8
(A') Pigment Dispersion Liquid
(A'-1) C.I. green pigment 7
(A'-2) C.I. green pigment 36
(B) Binder Resin
  A methacrylic acid/benzylmethacrylate copolymer having a weight average molecular weight of 22,000 g/mol (a mixed weight ratio=15/85)
(C) Photopolymerizable Monomer
  Dipentaerythritolhexaacrylate
(D) Photopolymerization Initiator
  (D-1) 1,2-octandione
  (D-2) 2-dimethylamino-2-(4-methyl-benzyl)-1-(4-morpholin-4-yl-phenyl)-butan-1-one
(E) Solvent
  (E-1) Cyclohexanone
  (E-2) Propylene Glycol Methyletheracetate Examples 1 to 16 and Comparative Examples 1 to 6

Photosensitive resin compositions were prepared by mixing each component in the compositions shown in Tables 1 and 2. Specifically, a photopolymerization initiator was dissolved in a solvent, the solution was stirred at room temperature for 2 hours, a dye (or pigment dispersion liquid) was added thereto, the mixture was stirred for 30 minutes, a binder resin and a photopolymerizable monomer were added thereto, and the obtained mixture was stirred at room temperature for 2 hours. The solution was three times filtered to remove impurities and prepare a photosensitive resin composition.

TABLE 1

(unit: wt %)

| | | Examples | | | | | | | | | | |
|---|---|---|---|---|---|---|---|---|---|---|---|---|
| | | 1 | 2 | 3 | 4 | 5 | 6 | 7 | 8 | 9 | 10 | 11 |
| (A) dye | A-1 | 2 | — | — | — | — | — | — | — | — | — | — |
| | A-2 | — | 2 | — | — | — | — | — | — | — | — | — |
| | A-3 | — | — | 2 | — | — | — | — | — | — | — | — |
| | A-4 | — | — | — | 2 | — | — | — | — | — | — | — |
| | A-5 | — | — | — | — | 2 | — | — | — | — | — | — |
| | A-6 | — | — | — | — | — | 2 | — | — | — | — | — |
| | A-7 | — | — | — | — | — | — | 2 | — | — | — | — |
| | A-8 | — | — | — | — | — | — | — | 2 | — | — | — |
| | A-9 | — | — | — | — | — | — | — | — | 2 | — | — |
| | A-10 | — | — | — | — | — | — | — | — | — | 2 | — |
| | A-11 | — | — | — | — | — | — | — | — | — | — | 2 |
| (A') pigment dispersion liquid | A'-1 | — | — | — | — | — | — | — | — | — | — | — |
| | A'-2 | — | — | — | — | — | — | — | — | — | — | — |
| (B) binder resin | | 3.5 | 3.5 | 3.5 | 3.5 | 3.5 | 3.5 | 3.5 | 3.5 | 3.5 | 3.5 | 3.5 |
| (C) photopolymerizable monomer | | 8 | 8 | 8 | 8 | 8 | 8 | 8 | 8 | 8 | 8 | 8 |
| (D) photopolymerization Initiator | D-1 | 1 | 1 | 1 | 1 | 1 | 1 | 1 | 1 | 1 | 1 | 1 |
| | D-2 | 0.5 | 0.5 | 0.5 | 0.5 | 0.5 | 0.5 | 0.5 | 0.5 | 0.5 | 0.5 | 0.5 |
| (E) solvent | E-1 | 40 | 40 | 40 | 40 | 40 | 40 | 40 | 40 | 40 | 40 | 40 |
| | E-2 | 45 | 45 | 45 | 45 | 45 | 45 | 45 | 45 | 45 | 45 | 45 |
| Total | | 100 | 100 | 100 | 100 | 100 | 100 | 100 | 100 | 100 | 100 | 100 |

TABLE 2

(unit: wt %)

| | | Examples | | | | | Comparative Examples | | | | | |
|---|---|---|---|---|---|---|---|---|---|---|---|---|
| | | 12 | 13 | 14 | 15 | 16 | 1 | 2 | 3 | 4 | 5 | 6 |
| (A) dye | A-12 | 2 | — | — | — | — | — | — | — | — | — | — |
| | A-13 | — | 2 | — | — | — | — | — | — | — | — | — |
| | A-14 | — | — | 2 | — | — | — | — | — | — | — | — |
| | A-15 | — | — | — | 2 | — | — | — | — | — | — | — |

TABLE 2-continued (unit: wt %)

| | | Examples | | | | | Comparative Examples | | | | | |
|---|---|---|---|---|---|---|---|---|---|---|---|---|
| | | 12 | 13 | 14 | 15 | 16 | 1 | 2 | 3 | 4 | 5 | 6 |
| | A-16 | — | — | — | — | 2 | — | — | — | — | — | — |
| | A-17 | — | — | — | — | — | 2 | — | — | — | — | — |
| | A-18 | — | — | — | — | — | — | 2 | — | — | — | — |
| | A-19 | — | — | — | — | — | — | — | 2 | — | — | — |
| | A-20 | — | — | — | — | — | — | — | — | 2 | — | — |
| (A') pigment dispersion | A'-1 | — | — | — | — | — | — | — | — | — | 35 | — |
| liquid | A'-2 | — | — | — | — | — | — | — | — | — | — | 35 |
| (B) binder resin | | 3.5 | 3.5 | 3.5 | 3.5 | 3.5 | 3.5 | 3.5 | 3.5 | 3.5 | 2.5 | 2.5 |
| (C) photopolymerizable Monomer | | 8 | 8 | 8 | 8 | 8 | 8 | 8 | 8 | 8 | 5 | 5 |
| (D) photopolymerization | D-1 | 1 | 1 | 1 | 1 | 1 | 1 | 1 | 1 | 1 | 1 | 1 |
| Initiator | D-2 | 0.5 | 0.5 | 0.5 | 0.5 | 0.5 | 0.5 | 0.5 | 0.5 | 0.5 | 0.5 | 0.5 |
| (E) solvent | E-1 | 40 | 40 | 40 | 40 | 40 | 40 | 40 | 40 | 40 | 40 | 40 |
| | E-2 | 45 | 45 | 45 | 45 | 45 | 45 | 45 | 45 | 45 | 16 | 16 |
| Total | | 100 | 100 | 100 | 100 | 100 | 100 | 100 | 100 | 100 | 100 | 100 |

Evaluation

Evaluation 1: Durability Evaluation

The photosensitive resin compositions according to Examples 1 to Example 16 and Comparative Examples 1 to 6 were respectively coated to be 1 μm to 3 μm thick on a 1 mm-thick degreased glass substrate and dried on a 90° C. hot plate for 2 minutes. The obtained films were exposed to light with a high pressure mercury lamp having a main wavelength of 365 nm and dried in a 200° C. oven for 20 minutes, and a spectrophotometer (MCPD3000, Otsuka Electronics Co., Ltd.) to measure color coordinate changes and thus evaluate durability, and the results are shown in Table 3.

Evaluation Reference of Durability

Good: less than or equal to 0.005 of the color coordinate change
Inferior: greater than 0.005 of color coordinate change

TABLE 3

| | Durability |
|---|---|
| Example 1 | Good |
| Example 2 | Good |
| Example 3 | Good |
| Example 4 | Good |
| Example 5 | Good |
| Example 6 | Good |
| Example 7 | Good |
| Example 8 | Good |
| Example 9 | Good |
| Example 10 | Good |
| Example 11 | Good |
| Example 12 | Good |
| Example 13 | Good |
| Example 14 | Good |
| Example 15 | Good |
| Example 16 | Good |
| Comparative Example 1 | Inferior |
| Comparative Example 2 | Inferior |
| Comparative Example 3 | Inferior |
| Comparative Example 4 | Inferior |
| Comparative Example 5 | Good |
| Comparative Example 6 | Good |

Referring to Table 3, Examples 1 to 16 including a core-shell dye according to an embodiment show increased durability compared with Comparative Examples 1 to 4 including a dye other than the core-shell dye.

Evaluation 2: Evaluation of Luminance and Contrast Ratio

The photosensitive resin compositions according to Examples 1 to 16 and Comparative Examples 1 to 6 were respectively coated to be 1 μm to 3 μm thick on a 1 mm-thick degreased glass substrate and dried on a 90° C. hot plate for 2 minutes to form films. The films were exposed to light with a high pressure mercury lamp having a main wavelength of 365 nm and dried in a 200° C. forced convection drying furnace for 5 minutes. Luminance and a contrast ratio of a pixel layer were measured by using a spectrophotometer (MCPD3000, Otsuka Electronics Co., Ltd.), and the results are shown in Table 4.

TABLE 4

| | Luminance | Contrast ratio |
|---|---|---|
| Example 1 | 67.7 | 14700 |
| Example 2 | 67.8 | 14500 |
| Example 3 | 67.6 | 14800 |
| Example 4 | 67.9 | 15200 |
| Example 5 | 67.3 | 14900 |
| Example 6 | 67.4 | 14300 |
| Example 7 | 67.5 | 14600 |
| Example 8 | 67.6 | 14800 |
| Example 9 | 67.7 | 14700 |
| Example 10 | 67.4 | 14900 |
| Example 11 | 67.5 | 14600 |
| Example 12 | 67.6 | 14500 |
| Example 13 | 67.3 | 14300 |
| Example 14 | 67.5 | 14700 |
| Example 15 | 67.7 | 15100 |
| Example 16 | 67.8 | 14900 |
| Comparative Example 1 | 65.4 | 13500 |
| Comparative Example 2 | 64.1 | 13100 |
| Comparative Example 3 | 64.3 | 13300 |
| Comparative Example 4 | 64.2 | 13200 |
| Comparative Example 5 | 62.1 | 12200 |
| Comparative Example 6 | 63.5 | 12500 |

Referring to Table 4, Examples 1 to 16 including a core-shell dye according to one embodiment showed high luminance and a high contrast ratio compared with Comparative Examples 1 to 6 not including the core-shell dye.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A photosensitive resin composition, comprising:

0.5 wt % to 4 wt % of a core-shell dye;

0.1 wt % to 30 wt % of a binder resin;

0.1 wt % to 30 wt % of a photopolymerizable monomer;

0.1 wt % to 30 wt % of a photopolymerization initiator; and a solvent, all wt % being based on a total weight of the photosensitive resin composition, wherein the core-shell dye includes:

a core comprising a compound represented by Chemical Formula 1-1 to Chemical Formula 1-8; and a shell surrounding the core and represented by Chemical Formula 2 or Chemical Formula 3,

[Chemical Formula 1-1]

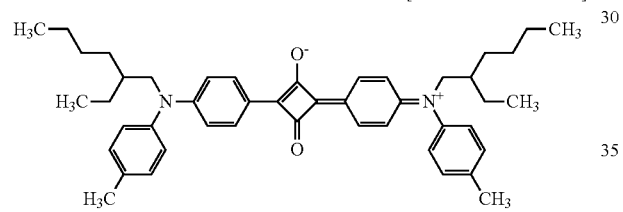

[Chemical Formula 1-2]

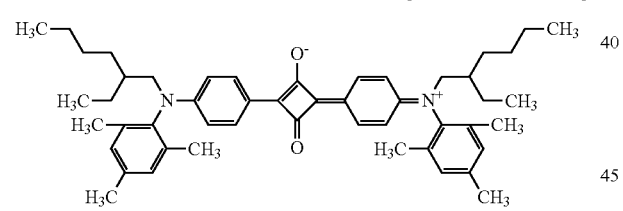

[Chemical Formula 1-3]

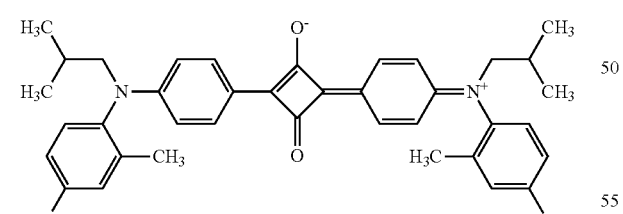

[Chemical Formula 1-4]

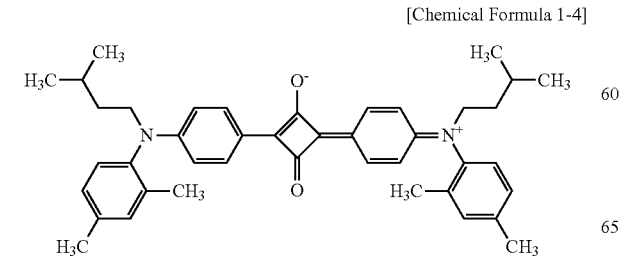

[Chemical Formula 1-5]

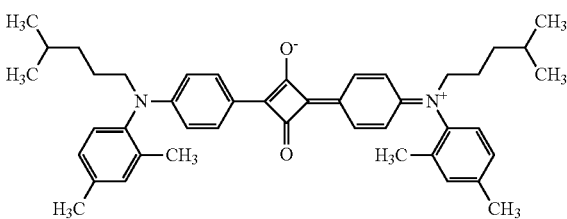

[Chemical Formula 1-6]

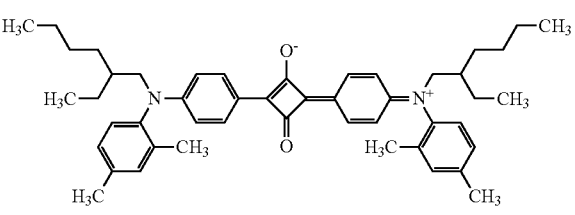

[Chemical Formula 1-7]

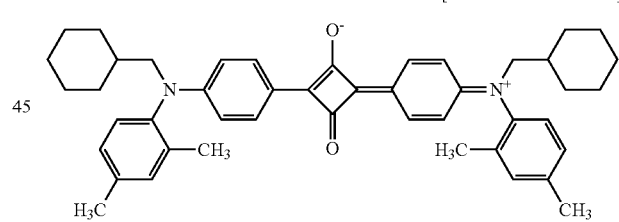

[Chemical Formula 1-8]

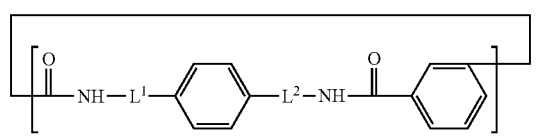

[Chemical Formula 2]

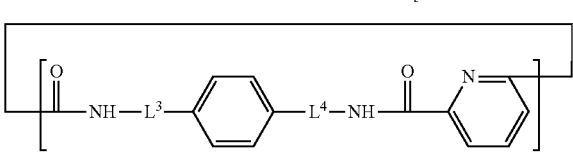

[Chemical Formula 3]

wherein, in Chemical Formula 2 and Chemical Formula 3,
L¹ to L⁴ are independently a single bond or a substituted or unsubstituted C1 to C10 alkylene group.

2. The photosensitive resin composition of claim 1, wherein $L^1$ to $L^4$ are independently a substituted or unsubstituted C1 to C10 alkylene group.

3. The photosensitive resin composition of claim 1, wherein the shell is represented by Chemical Formula 2-1 or Chemical Formula 3-1,

[Chemical Formula 2-1]

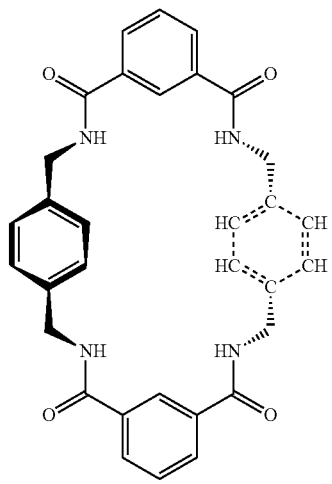

[Chemical Formula 3-1]

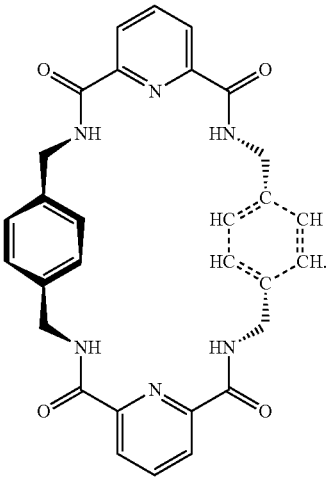

4. The photosensitive resin composition of claim 3, wherein a cage width of the shell ranges from 6.5 Å to 7.5 Å.

5. The photosensitive resin composition of claim 1, wherein the core has a length of 1 nm to 3 nm.

6. The photosensitive resin composition of claim 1, wherein the core has a maximum absorption peak in a wavelength of 530 nm to 680 nm.

7. The photosensitive resin composition of claim 1, wherein the core-shell dye is selected from compounds represented by Chemical Formula 4 to Chemical Formula 19,

[Chemical Formula 4]

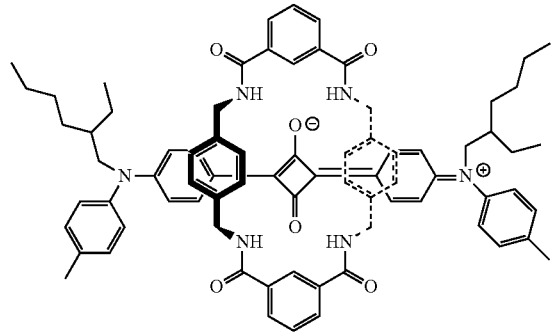

[Chemical Formula 5]

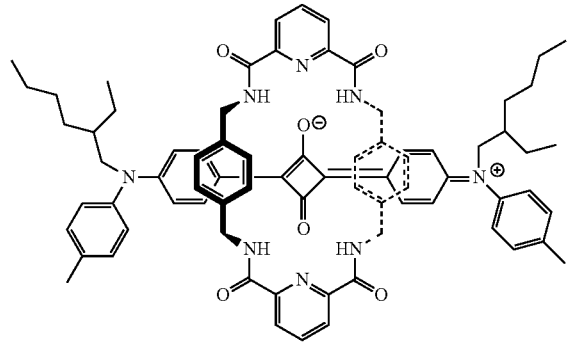

[Chemical Formula 6]

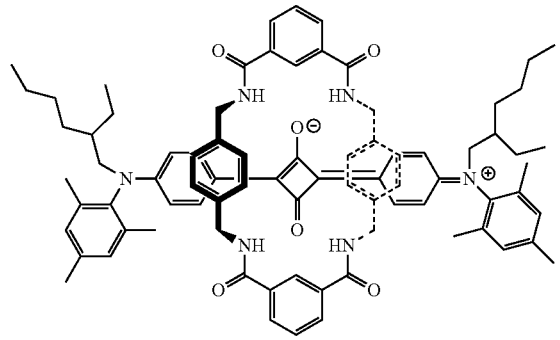

[Chemical Formula 7]

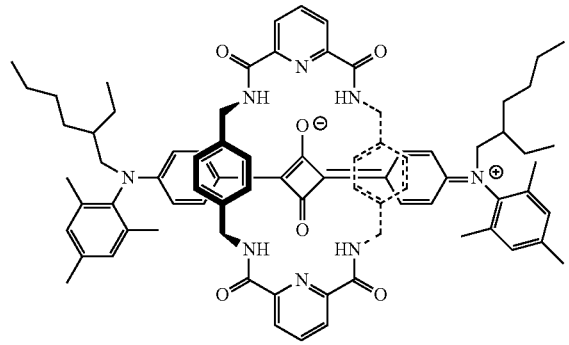

-continued
[Chemical Formula 8]
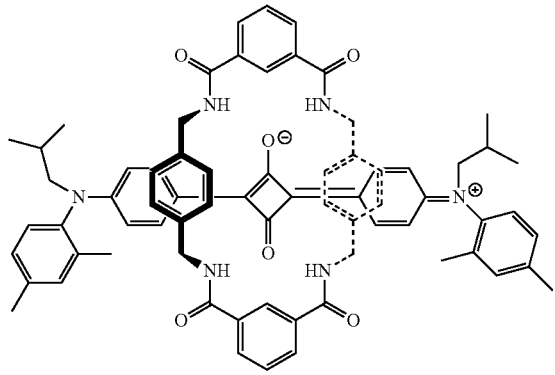
[Chemical Formula 9]
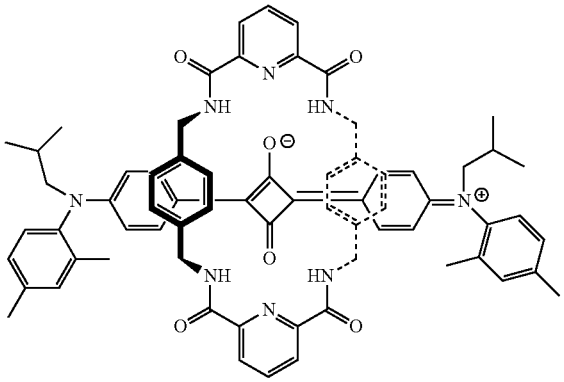
[Chemical Formula 10]
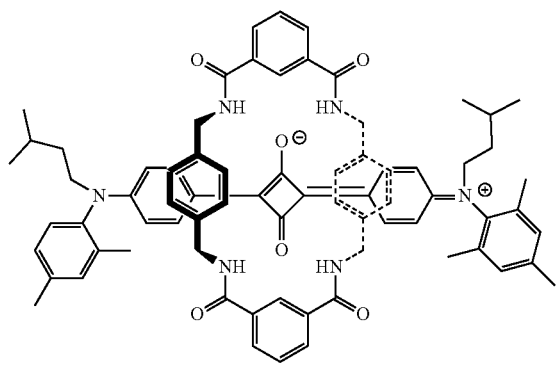
[Chemical Formula 11]
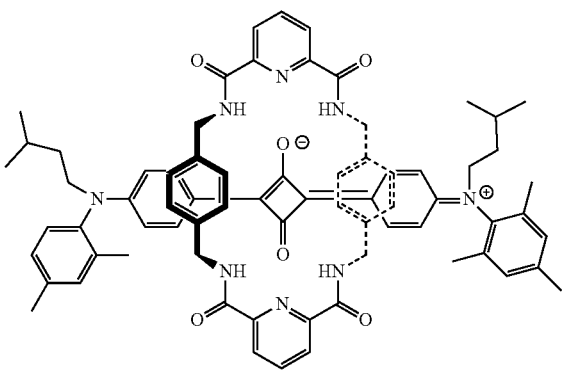
[Chemical Formula 12]
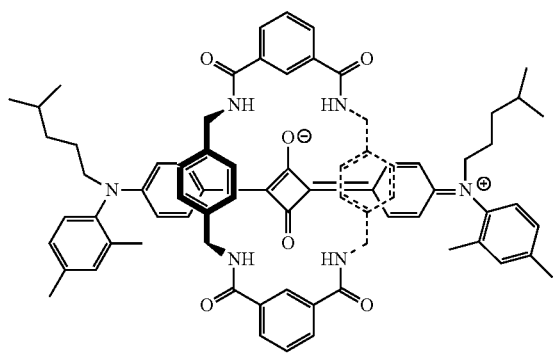
[Chemical Formula 13]
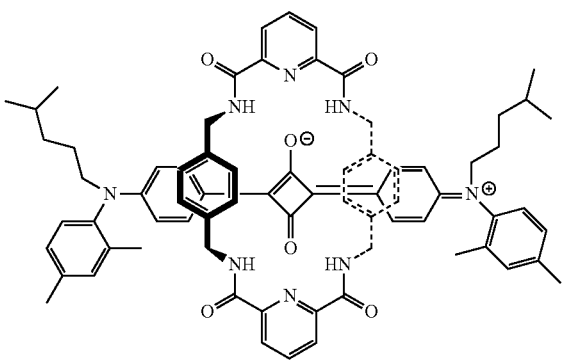
[Chemical Formula 14]
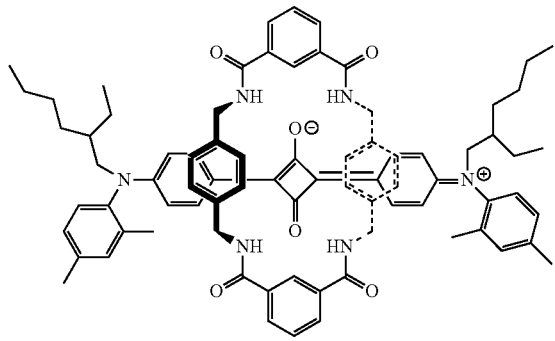
[Chemical Formula 15]
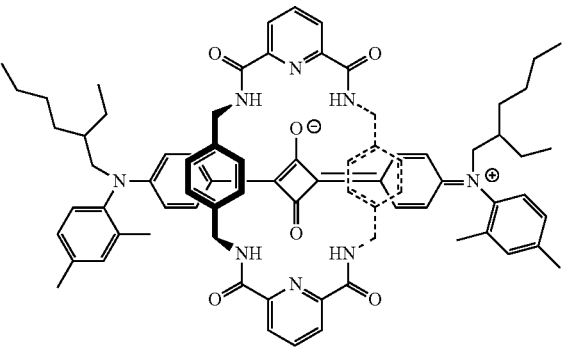

[Chemical Formula 16]

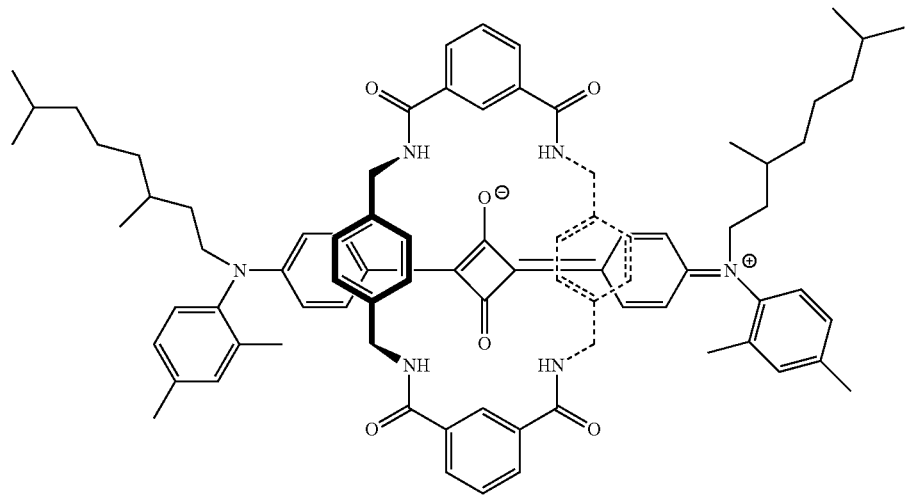

[Chemical Formula 17]

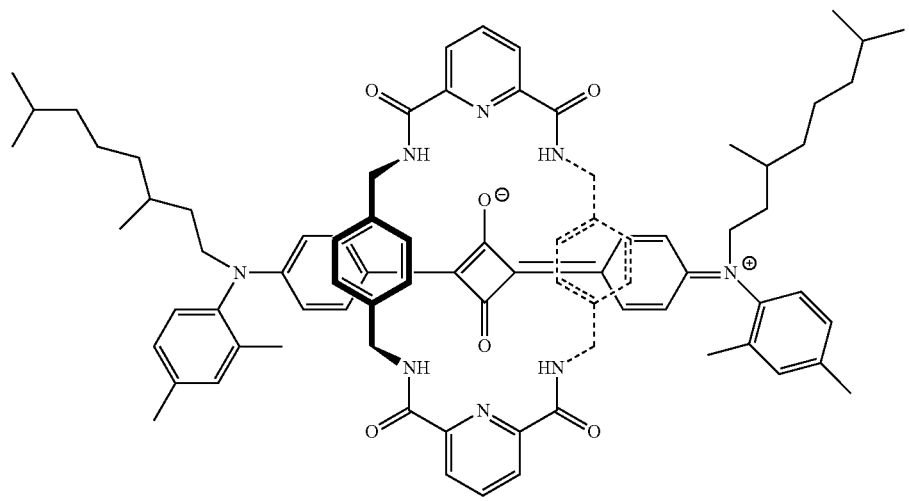

[Chemical Formula 18]

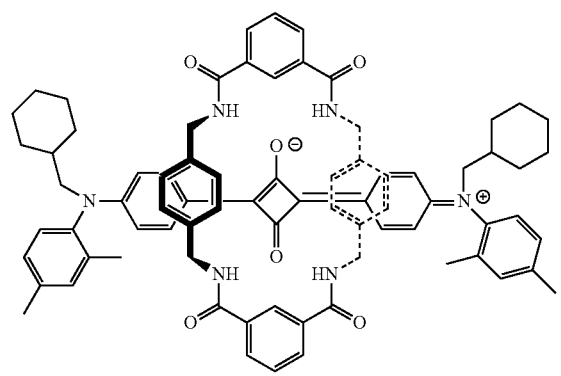

[Chemical Formula 19]

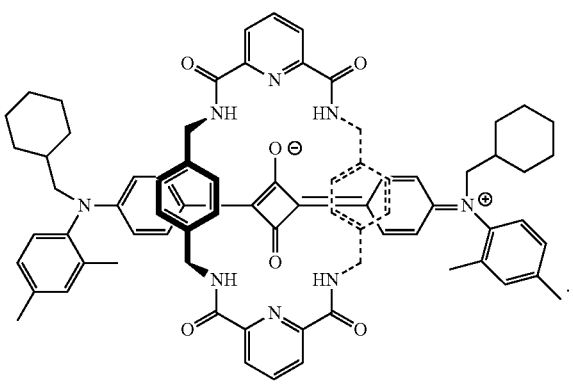

8. The photosensitive resin composition of claim 1, wherein the core-shell dye includes the core and the shell in a mole ratio of 1:1.

9. The photosensitive resin composition of claim 1, wherein the core-shell dye is a green dye.

10. The photosensitive resin composition of claim 1, wherein the photosensitive resin composition further includes a pigment.

11. The photosensitive resin composition of claim 1, wherein the photosensitive resin composition further includes malonic acid, 3-amino-1,2-propanediol, a silane-based coupling agent including a vinyl group or a (meth)acryloxy group, a leveling agent, a surfactant, a radical polymerization initiator, or a combination thereof.

12. A color filter manufactured comprising the photosensitive resin composition of claim 1.

* * * * *